United States Patent
Mei

(10) Patent No.: US 12,231,028 B2
(45) Date of Patent: Feb. 18, 2025

(54) PULSE FREQUENCY MODULATOR FOR SWITCHED MODE POWER SUPPLY

(71) Applicant: TEXAS INSTRUMENTS INCORPORATED, Dallas, TX (US)

(72) Inventor: Tawen Mei, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 152 days.

(21) Appl. No.: 17/682,764

(22) Filed: Feb. 28, 2022

(65) Prior Publication Data

US 2023/0275573 A1    Aug. 31, 2023

(51) Int. Cl.
*H02M 3/156*    (2006.01)
*H02M 1/00*    (2006.01)
*H03K 4/00*    (2006.01)

(52) U.S. Cl.
CPC ....... *H02M 1/0025* (2021.05); *H02M 1/0032* (2021.05); *H02M 1/0041* (2021.05); *H02M 3/156* (2013.01); *H03K 4/00* (2013.01)

(58) Field of Classification Search
CPC ............ H02M 1/0003; H02M 1/0025; H02M 1/0032; H02M 1/0041; H03K 7/06
See application file for complete search history.

(56) References Cited

U.S. PATENT DOCUMENTS

| | | | |
|---|---|---|---|
| 10,511,226 B1 | 12/2019 | Gurlahosur et al. | |
| 10,784,780 B1 | 9/2020 | Scandola et al. | |
| 2007/0210772 A1* | 9/2007 | Sawtell | H02M 3/156 323/282 |
| 2009/0243580 A1* | 10/2009 | Chen | H02M 3/156 323/288 |
| 2014/0266117 A1 | 9/2014 | Goncalves et al. | |
| 2015/0137776 A1* | 5/2015 | Thomas | H02M 3/1588 323/271 |
| 2015/0303902 A1 | 10/2015 | Steedman et al. | |
| 2016/0308448 A1* | 10/2016 | Nishijima | H02M 3/33507 |
| 2018/0123581 A1 | 5/2018 | Chiu et al. | |
| 2019/0081546 A1 | 3/2019 | Hsu et al. | |
| 2020/0091822 A1 | 3/2020 | Ou et al. | |
| 2020/0274445 A1 | 8/2020 | Mei et al. | |
| 2020/0336065 A1* | 10/2020 | Mei | H02M 3/156 |
| 2020/0373835 A1 | 11/2020 | Lee et al. | |

OTHER PUBLICATIONS

International Search Report dated May 31, 2023.

* cited by examiner

*Primary Examiner* — Alex Torres-Rivera
(74) *Attorney, Agent, or Firm* — Charles F. Koch; Frank D. Cimino

(57) ABSTRACT

In some examples, an apparatus comprises: an amplifier having an amplifier output and first and second amplifier inputs, the first amplifier input coupled to a reference voltage terminal, and the second amplifier input coupled to a power input terminal; a ramp generation circuit having a reset input and a ramp output; a comparator having a comparator output and first and second comparator inputs, the first comparator input coupled to the amplifier output, and the second comparator input coupled to the ramp output; and a switching signal generation circuit having a circuit input and a circuit output, the circuit input coupled to the comparator output, and the circuit output coupled to a power control terminal.

19 Claims, 12 Drawing Sheets

PULSE FREQUENCY MODULATOR FOR SWITCHED MODE POWER SUPPLY

BACKGROUND

A switched mode power supply (SMPS) uses semiconductor switching techniques to transfer power from an input power source to a load. The SMPS may include an energy storage element (such as an inductor, a capacitor, a transformer, etc.) and switches. Through the operation of the switches, the energy storage element can continuously switch between a charging state and a discharging state in each switching cycle. A controller of the SMPS can determine the on-time and off-time of the switches, which can reflect the time durations of the charging and discharging states in a switching cycle, so the SMPS can provide a desired power to the load.

SUMMARY

An apparatus comprises an amplifier, a ramp generation circuit, a comparator, and a switching signal generation circuit. The amplifier has an amplifier output and first and second amplifier inputs. The first amplifier input is coupled to a reference voltage terminal, and the second amplifier input is coupled to a power input terminal. The ramp generation circuit has a reset input and a ramp output. The comparator has a comparator output and first and second comparator inputs. The first comparator input is coupled to the amplifier output, and the second comparator input is coupled to the ramp output. The switching signal generation circuit has a circuit input and a circuit output. The circuit input is coupled to the comparator output, and the circuit output is coupled to a power control terminal.

In a method, a reference voltage and a first voltage representing an output voltage of a power converter are received. A first signal representing a difference between the first voltage and the reference voltage is generated. A ramp signal that starts ramping during a switching cycle of the power converter is generated. A second signal indicating whether the ramp signal intersects with the first signal is generated. The switching cycle is stopped responsive to the second signal indicating that the ramp signal intersects with the first signal.

DETAILED DESCRIPTION

Figure 1:
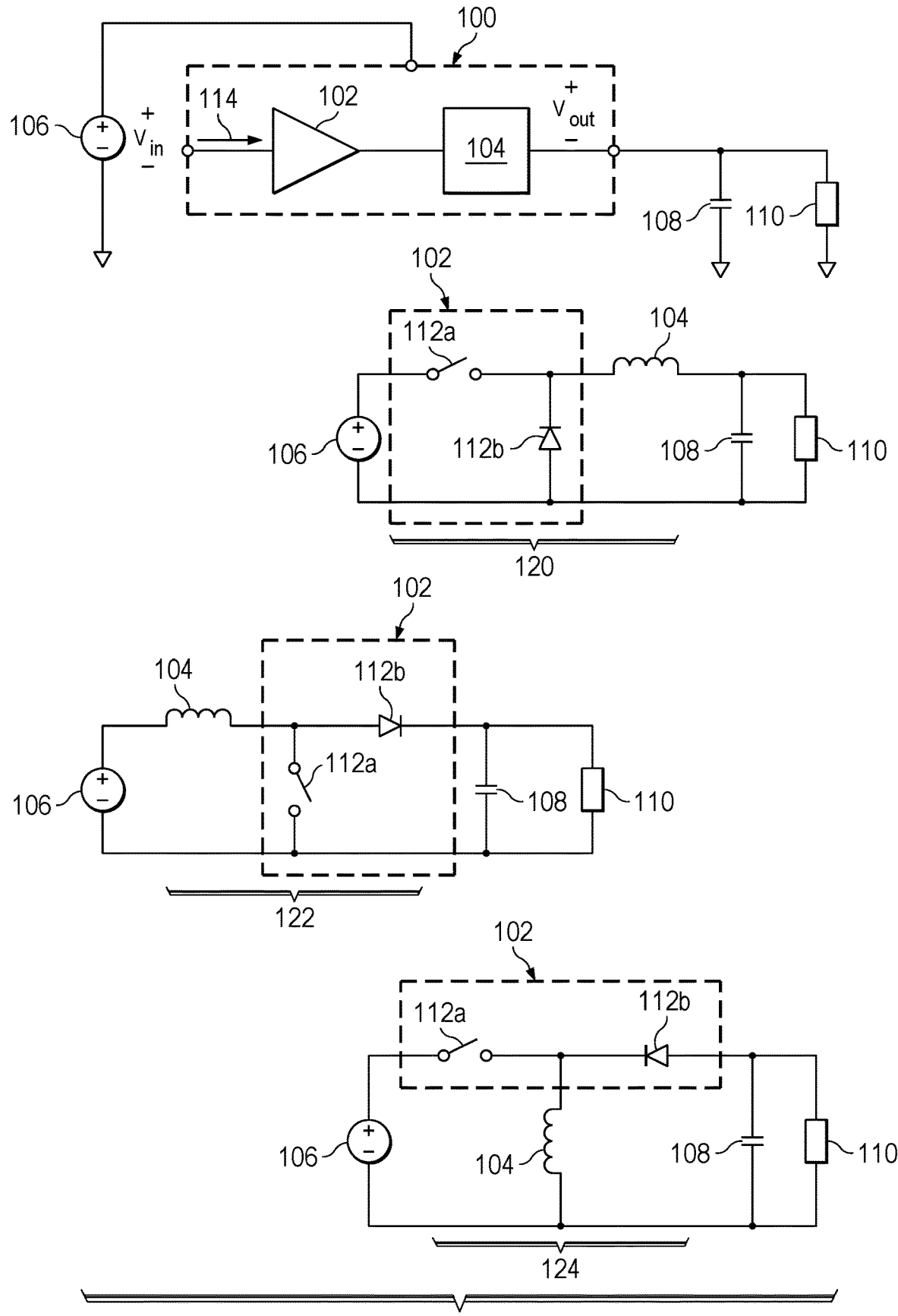
FIG. 1 includes schematics of examples of switched mode power supplies (SMPS).

FIG. 1 illustrates schematics of examples of a switched mode power supply (SMPS) 100. Referring to the top of FIG. 1, SMPS 100 can include a power stage 102 and an energy storage element 104 coupled between a power source 106, a capacitor 108, and a load 110. Power source 106 can provide an input voltage (labelled "$V_{in}$" in FIG. 1) to SMPS 100. Power stage 102 can include switches 112a and 112b. Switch 112a can include a transistor such as a field effect transistor (FET). Switch 112b can be configured as a rectifier switch and can include a diode, or a transistor (e.g., a FET) if switch 112b is a synchronous switch. Energy storage element 104 can include, for example, an inductor, a capacitor, or a transformer. Power stage 102 can receive a switching signal 114 that can switch the states of switch 112a and switch 112b. Through the switching of switches 112a and 112b, energy storage element 104 can switch between a charging state in which energy storage element 104 stores energy received from power source 106, and a discharging state in which energy storage element 104 provides the stored energy, in the form of an output voltage (labelled "$V_{out}$" in FIG. 1) and an output current, to load 110. Capacitor 108 can smooth out the ripples of the output voltage. The bottom of FIG. 1 illustrates example configurations of power stage 102 and energy storage element 104, such as a buck converter 120, a boost converter 122, and a buck-boost converter 124, where energy storage element 104 can be an inductor.

Figure 2:
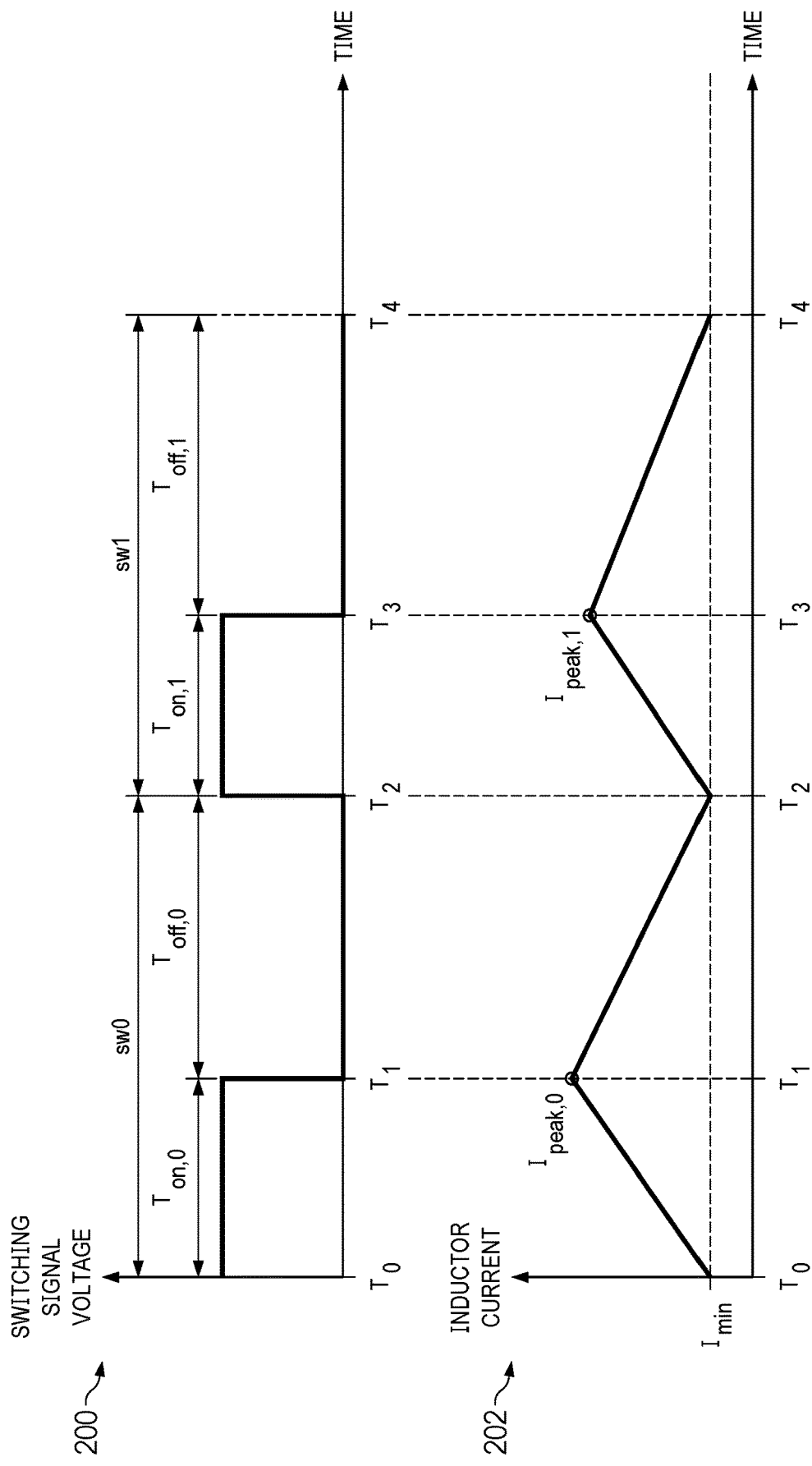
FIG. 2 and FIG. 3 are waveform graphs that illustrate example operations of the SMPS of FIG. 1.
Figure 3:
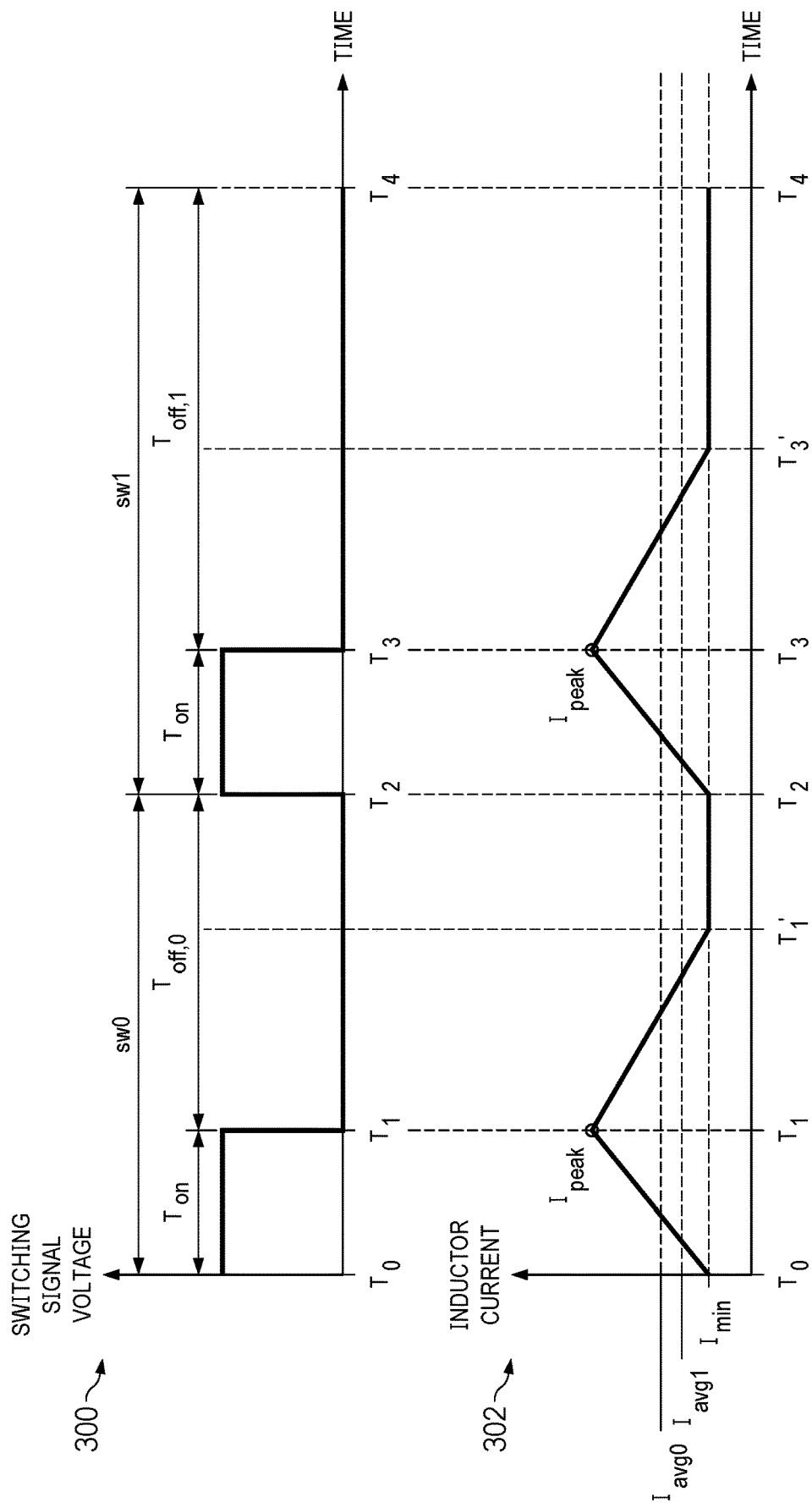

FIG. 2 and FIG. 3 are waveform graphs that illustrate example operations of SMPS 100. In FIG. 2, graph 200 is a plot of a voltage of switching signal 114 with respect to time, and graph 202 is a plot of a current conducted by energy storage element (e.g., inductor) 104. Graph 200 illustrates two example switching cycles of switching signal 114 labelled sw0 and sw1. Switching cycle sw0 spans from time $T_0$ to $T_2$, and switching cycle sw1 spans from time $T_2$ to $T_4$. Switching cycle sw0 has an on-time $T_{on,0}$ between $T_0$ and $T_1$ in which inductor 104 is in a charging state, and an off-time $T_{off,0}$ between $T_1$ and $T_2$ in which inductor 104 is in a discharging state. Also, switching cycle sw1 has an on-time $T_{on,1}$ between $T_2$ and $T_3$ in which inductor 104 is in the charging state again, and an off-time $T_{off,1}$ between $T_3$ and $T_4$ in which inductor 104 is in the discharging state again. When inductor 104 is in the charging state, inductor 104 can receive a current from power source 106, and the current increases from a minimum current $I_{min}$ to a peak current $I_{peak}$ with respect to time as magnetic energy is stored in inductor 104. The rate of increase of the inductor current within the on-time can be based on a voltage across inductor 104, which can be based on the input voltage $V_{in}$. When inductor 104 is in the discharging state, inductor 104 can release the stored magnetic energy and provides a current, which decreases from $I_{peak}$ back to $I_{min}$ with respect to time. The rate of decrease of the inductor current within the off-time can be based on a voltage across inductor 104, which can be based on the output voltage $V_{out}$.

The duration of on-time within a switching cycle can affect the peak current and the amount of magnetic energy stored in inductor 104, which can also affect the energy provided by inductor 104 to load 110. For example, in FIG. 2, the on-time $T_{on,0}$ of switching cycle sw0 can be longer than the on-time $T_{on,1}$ of switching cycle sw1, and the peak current $I_{peak,0}$ in switching cycle sw0 can become larger than the peak current $I_{peak,1}$ in switching cycle sw1. Accordingly, inductor 104 can provide less energy to load 110 in switching cycle sw1 than in switching cycle sw2. Also, the duty cycle of a switching cycle, which can be defined by a ratio between the on-time duration and the cycle period duration, can determine the ratio between the input voltage $V_{in}$ and the output voltage $V_{out}$.

In some examples, SMPS 100 can be controlled by a controller that implements a feedback system to regulate the on-time and off-time of the switching cycles, such that the SMPS can provide a desired voltage and/or a desired current to the load. Specifically, the controller can receive measurements of the current conducted by inductor 104, and measurements of the voltage provided by SMPS 100. Based on comparing the current conducted by inductor 104 and a desired/target current value, the controller can adjust the on-time of the switching cycle, which can also adjust the duration of the charging state of inductor 104 within the switching cycle as well as the peak inductor current. Also, based on comparing the voltage provided by SMPS 100 and a reference voltage, the controller can adjust the on-time and/or the duty cycle of the switching cycle to regulate the output voltage of SMPS 100 at the reference voltage.

The controller can determine the on-time and off-time of a switching cycle based on various techniques, including pulse width modulation (PWM) and pulse frequency modulation (PFM). With PWM, the switching cycle period as well as the switching frequency can be kept constant. Due to the constant switching frequency, PWM can provide a predictable operating frequency and low output ripple characteristics. SMPS 100 can also operate with high efficiency during heavy load conditions where the switching loss incurred by power stage 102 can be small compared with the amount of power transferred to load 110. The controller can adjust the on-time of the switching cycle to adjust the peak inductor current as well as the output voltage. The operation in FIG. 2 can be based on PWM. In FIG. 2, switching cycles sw0 and sw1 can have identical duration. In switching cycle sw0, the controller can set the on-time $T_{on,0}$ to obtain a peak inductor current of $I_{peak,0}$. In switching cycle, sw1 the controller can set a different on-time $T_{on,1}$ to obtain a different peak inductor current of $I_{peak,1}$.

The controller can also determine the on-time and off-time of a switching cycle based on PFM. With PFM, the controller can maintain the on-time at a constant, and adjust the switching frequency to adjust the power provided to the load. PFM can improve the efficiency of SMPS when operating in a low load condition or a standby condition. In such conditions, as the demand for current from the load is reduced to close to zero. The switching frequency can be reduced, and the switching loss incurred by power stage 102 can also be reduced compared with the power being transmitted by SMPS 100, which can improve the efficiency of the SMPS. Also, as the switching frequency is reduced, the average inductor current can also be reduced to match the current demand of the load.

FIG. 3 includes waveform graphs that illustrate example operations of SMPS 100 based on PFM. In FIG. 3, graph 300 is a plot of the voltage of switching signal 114 with respect to time, and graph 302 is a plot of the current conducted by inductor 104. Two switching cycles (sw0 and sw1) are shown in FIG. 3. With PFM, the controller can maintain the on-time while adjusting the off-time of the switching cycles. For example, in FIG. 2, both switching cycles sw0 and sw1 have identical on-time $T_{on}$ which can lead to identical peak inductor current $I_{peak}$. But switching cycles sw0 and sw1 can have different respective off-times $T_{off,0}$ and $T_{off,1}$. With each off-time, the inductor current can drop from $I_{peak}$ to a minimum current $I_{min}$, and stay at $I_{min}$ for a certain duration. For example, in switching cycle sw0, inductor 104 conducts the minimum current $I_{min}$ between $T_1'$ to $T_2$, and in switching cycle sw1, inductor 104 conducts the minimum current $I_{min}$ between $T_3'$ to $T_3$. Due to the different durations of $I_{min}$, the average current can be different between the switching cycles. In FIG. 2, as $T_{off,1}$ of sw1 is longer than $T_{off,0}$ of sw0, the average current $I_{avg,0}$ of sw0 can be higher than the average current $I_{avg,1}$ of sw1. The controller can increase $T_{off,1}$ to reduce the average current provided to load 110 within switching cycle sw1 according to the reduced demand for current from load 110. The duty cycle of the switching signals, which changes with the off-time, can also set the output voltage $V_{out}$ of SMPS 100.

Figure 4:
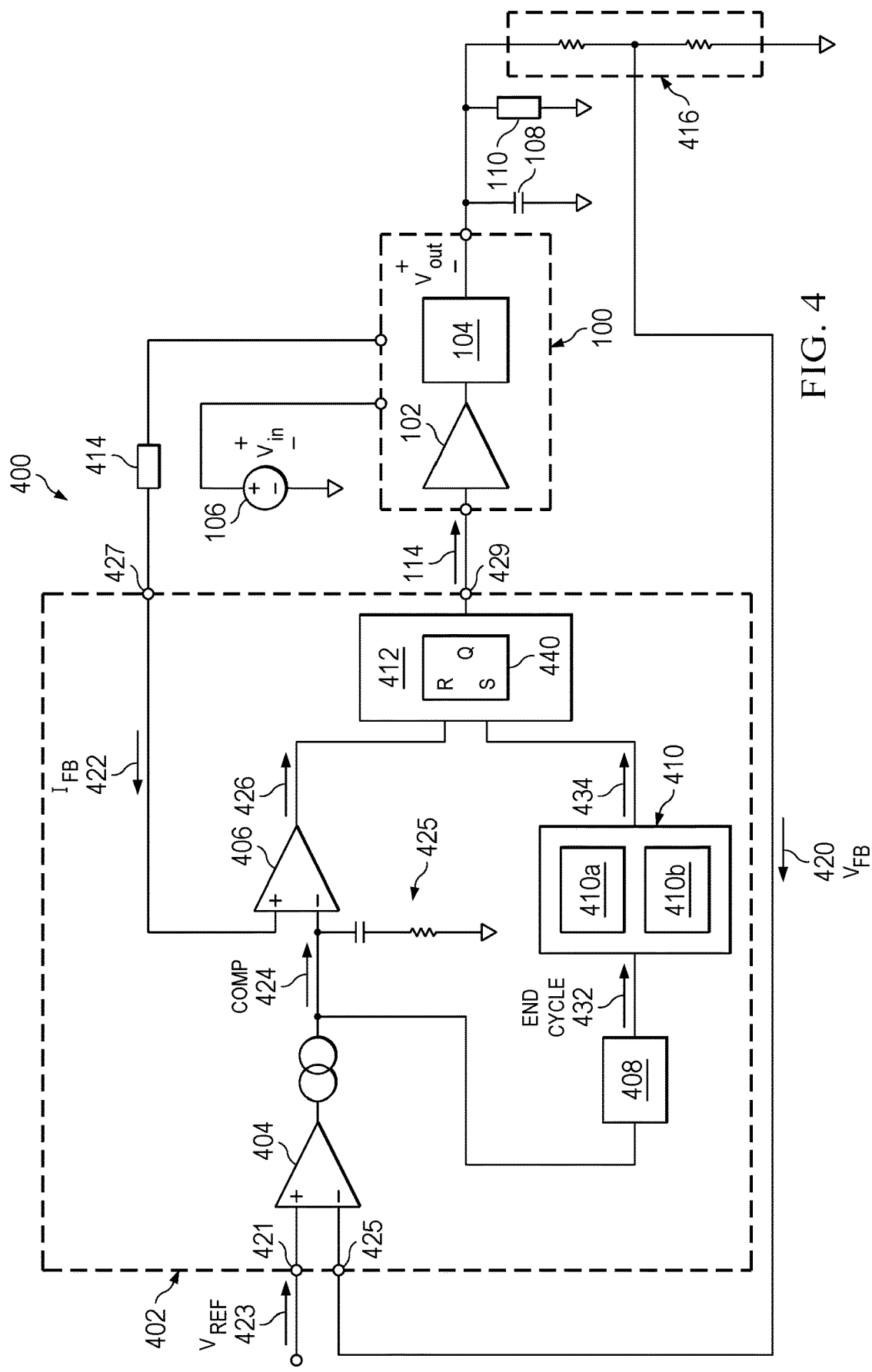
FIG. 4 is a schematic of a power supply system.

FIG. 4 is a schematic of an example power supply system 400 including SMPS 100 and a controller 402. Controller 402 can switch between operating SMPS 100 in a PWM mode and in a PFM mode depending on the load condition. In a light load condition or a standby condition where SMPS 100 is to supply a reduced amount of current to load 110, controller 402 can operate SMPS 100 in a PFM mode. In the PFM mode, controller 402 can keep the on-time of the switching cycles (when energy storage element 104 is in a charging state) constant, while varying the switching frequency to adjust the average current provided to load 110. Also, in a medium to heavy load condition, controller 402 can operate SMPS 100 in a PWM mode, in which controller 402 can keep the switching frequency constant, while varying the on-time of the switching cycles to adjust the peak current provided to load 110. Controller 402 can also implement a feedback loop to regulate the current and voltage provided by SMPS 100 to load 110 in both PWM and PFM modes.

In some examples, controller 402 can include an amplifier 404, a comparator 406, a switching frequency modulation circuit 408, a clock generation circuit 410, and a switching signal generation circuit 412. Power supply system 400 further includes a current feedback circuit 414 and a voltage feedback circuit 416. In some examples, voltage feedback circuit 416 can include a resistive divider to generate a feedback voltage signal ($V_{FB}$) signal 420 which represents the output voltage ($V_{out}$) of SMPS 100. Also, current feedback circuit 414 can include a current measurement circuit (e.g., a resistor) to generate a voltage signal that reflects a current conducted by energy storage element (e.g., inductor) 104 as a feedback current signal ($I_{FB}$) 422. Amplifier 404 can have a first amplifier input (e.g., a positive input) coupled to a reference voltage terminal 421, which can be coupled to reference voltage source (not shown in FIG. 3), to receive a reference voltage ($V_{REF}$) 423 that can be based on a target output voltage of SMPS 100. Amplifier 404 can also have a second amplifier input (e.g., a negative input) coupled to a power input terminal 425, which can be coupled to voltage feedback circuit 416, to receive $V_{FB}$ signal 420. Also, the output of amplifier 404 can be coupled to comparator 406 and switching frequency modulation circuit 408, and switching frequency modulation circuit 408 can be coupled to clock generation circuit 410. A first comparator input (e.g., a positive input) of comparator 406 can be coupled to a current feedback terminal 427, which can be coupled to current feedback circuit 414, to receive $I_{FB}$ signal 422. The output of comparator 406 and the output of clock generation circuit 410 can be coupled to switching signal generation circuit 412, which can be coupled to a power control terminal 427. Power control terminal 429 can be coupled to power stage 102 of SMPS 100 (e.g., switch 112a). Through power control terminal 429, switching signal generation circuit 412 can provide switching signal 114 to power stage 102.

Specifically, amplifier 404 can generate a COMP signal 424 representing how much $V_{FB}$ is below $V_{REF}$. COMP signal 424 can represent a voltage error to be eliminated by the feedback loop to regulate the voltage provided by SMPS 100. Also, COMP signal 424 can represent a target current demanded by load 110. A small COMP signal 424 can indicate that inductor 104 provides sufficient current to load 110. This can prevent (or reduce) the discharging of capacitor 108 and the ensuing reduction of $V_{FB}$. Accordingly, a small COMP signal 424 can indicate a small current demand from load 110. In contrast, a large COMP signal 424 can indicate that the inductor 104 provides insufficient current to load 110. This can cause capacitor 108 to discharge to supply additional current to load 110 and reduce $V_{FB}$. As $V_{FB}$ is reduced, the voltage error and COMP signal 424 can increase, which can indicate a large current demand from load 110. In some examples, amplifier 404 can include a transconductance amplifier to generate a current signal based on the difference between $V_{FB}$ and $V_{REF}$, and COMP signal 424 can be based on the current signal. The output of amplifier 404 can be coupled to a compensation network 425 that can include a series combination of capacitor and resistor. Compensation network 425 can improve the stability of the feedback loop, and can also convert the current signal provided by amplifier 404 into a voltage signal for COMP signal 424.

Controller 402 can determine whether to operate in the PWM mode or in the PFM mode based on the magnitude of COMP signal 424. For example, if both COMP signal 424 and $I_{FB}$ 422 exceed the minimum inputs for which comparator 406 can generate a decision, comparator 406 can compare COMP signal 424 against $I_{FB}$ signal 422 to generate a decision signal 426 that switches state, and provide decision signal 426 to switching signal generation circuit 412 to set the on-time of switching signal 114, such that the peak current conducted by inductor 104 can match the target current represented by COMP signal 424. But if COMP signal 424 and $I_{FB}$ signal 422 are below the minimum input signal level of comparator 406, comparator 406 may generate a flat decision signal 326.

Switching frequency modulation circuit 408 can receive COMP signal 424 from amplifier 404. As to be described below, based on the magnitude of COMP signal 424, which can reflect the target current and the load condition, switching frequency modulation circuit 408 can determine whether to operate SMPS 100 in the PFM mode. If switching frequency modulation circuit 408 determines that SMPS 100 is to operate in the PFM mode, switching frequency modulation circuit 408 can provide an end cycle signal 432, which can be in the form of a pulse, to clock generation circuit 410 to stop a current switching cycle and start a subsequent switching cycle. Switching frequency modulation circuit 408 can determine the timing of end cycle signal 432 such that the switching cycle period (and switching frequency) can reflect the magnitude of COMP signal 424. For example, switching frequency modulation circuit 408 can push out end cycle signal 432 to increase the switching cycle period in response to a small COMP signal 424, and pull in end cycle signal 432 to decrease the switching cycle period in response to a large COMP signal 424. Also, if switching frequency modulation circuit 408 determines that SMPS 100 is to operate in the PWM mode, switching frequency modulation circuit 408 can provide a static end cycle signal 432 to clock generation circuit 410.

In some examples, clock generation circuit 410 can include an oscillator 410a and a trigger-based signal generator 410b. When operating in the PWM mode where end cycle signal 432 is static, clock generation circuit 410 can generate a clock signal 434 having a constant frequency using the oscillator 410a. When operating in the PFM mode, clock generation circuit 410 can provide the pulsed end cycle signal 332 as triggers to trigger-based signal generator 410b to generate clock signal 434, which can have a variable switching frequency based on separation between pulse signals of end cycle signal 322. Clock generation circuit 410 can provide clock signal 434 to switching signal generation circuit 412, which can generate switching signal 114 based on clock signal 434.

In some examples, switching signal generation circuit 412 can include a digital logic circuit, such as an S-R latch (or an S-R flip-flop) 440 as shown in FIG. 4. The reset input (R) of S-R latch 440 can be coupled to the output of comparator 406 to receive decision signal 426, the set input (S) of S-R latch a440 can be coupled to the clock generation circuit 410 to receive clock signal 434, and output (Q) of the S-R latch 440 can be coupled to power stage 102 to provide switching signal 114. When operating in the PWM mode, the on-time of switching signal 114 can be modulated by the resetting of S-R latch 440 by decision signal 426 from comparator 406. When operating in PFM mode, switching signal generation circuit 412 can reset S-R latch 440 after a pre-determined duration has elapsed from the setting of S-R latch 440 by clock generation circuit 410 to maintain a constant on-time, or an on-time derived from $V_{IN}$, $V_{OUT}$, inductance of 104, and/or nominal switching frequency, across switching cycles.

Figure 5:
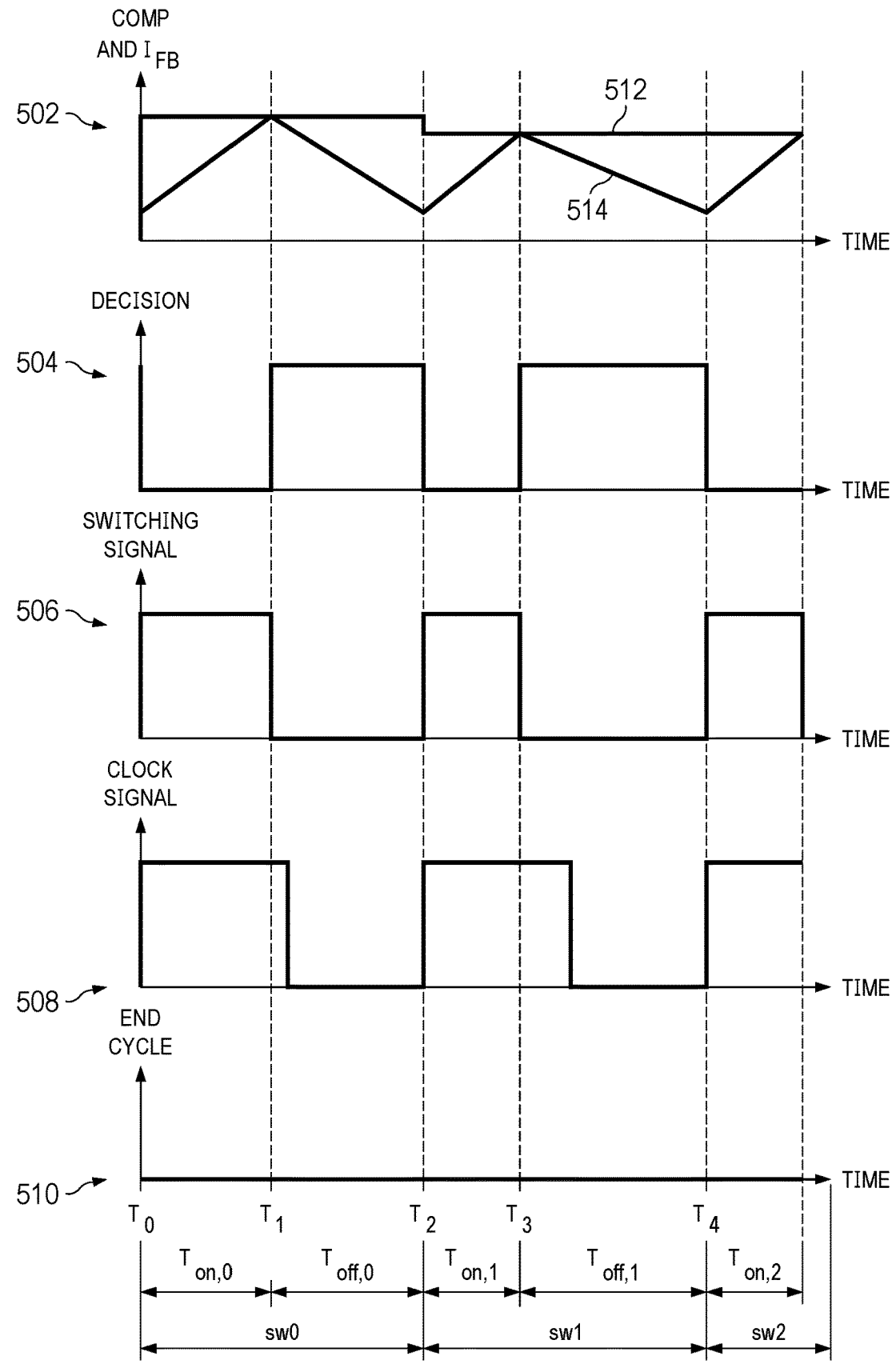
FIGS. 5, 6 and 7 are waveform graphs that illustrate operations of the power supply system of FIG. 4 in pulse width modulation (PWM) mode and in pulse frequency modulation (PFM) mode.

FIG. 5 includes waveform graphs that illustrate example operations of power supply system 400 in PWM mode. FIG. 5 includes graphs 502, 504, 506, 508, and 510. Graph 502 includes a plot 512 of COMP signal 424 and a plot 514 of $I_{FB}$ signal 422 with respect to time. Both COMP signal 424 and $I_{FB}$ signal 422 are represented as voltages in graph 502. Also, graph 506 is a plot of switching signal 114 with respect to time, graph 508 is a plot of clock signal 434 with respect to time, and graph 510 is a plot of end cycle signal 432. In FIG. 5, two complete switching cycles sw0 and sw1 and part of a switching cycle sw2 are illustrated.

Referring to FIG. 5, end cycle signal 432 can remain static in PWM mode, and clock generation circuit 410 can generate a clock signal 434 having a constant frequency using the oscillator 410a. Accordingly, switching cycles sw0, sw1, and sw2 can have identical cycle period. A clock cycle of clock signal 434, as well as switching cycle sw0, starts at time T0. At time $T_0$, clock signal 434 has an asserted state (e.g., logical one) and can set the output (Q) of S-R latch 340 to start the on-time $T_{on,0}$ of switching cycle sw0. Within the on-time $T_{on,0}$, inductor 104 can be in a charging state, and the inductor current starts to increase.

Decision signal 426 of comparator 406 can be in a de-asserted state (e.g., logical zero) at time $T_0$. At time $T_1$, the inductor current reaches a target value represented by COMP signal 424, and comparator 406 can trip. Decision signal 426 can switch from the de-asserted state to the asserted state at time $T_1$. The asserted decision signal 426 can reset the S-R latch, which can stop $T_{on,0}$ and the charging of inductor 104. The resetting of the S-R latch can also start the off-time $T_{off,0}$ of switching cycle sw0 and the discharging of inductor 104.

At $T_2$, clock generation circuit 410 provides a new clock cycle of clock signal 434. Clock signal 434 can be in the asserted state again and ends the off-time $T_{off,0}$ of switching cycle sw0 and starts the subsequent switching cycle sw1. The on-time of switching cycle sw1 $T_{on,1}$ also starts at $T_2$. COMP signal 424 is reduced in switching cycle sw1 with respect to switching cycle sw0. Accordingly, comparator 406 can stop the charging of inductor 104 at $T_3$ to match the reduced COMP signal 424, and the on-time $T_{on,1}$ of switching cycle sw1 becomes shorter than the on-time $T_{on,0}$ of switching cycle sw0. The off-time of switching cycle sw1, $T_{off,1}$, starts at $T_3$ and ends at $T_4$. The next clock cycle of clock signal 434, the next switching cycle sw2, and the on-time of the switching cycle $T_{on,2}$ also begin at $T_4$.

Figure 6:
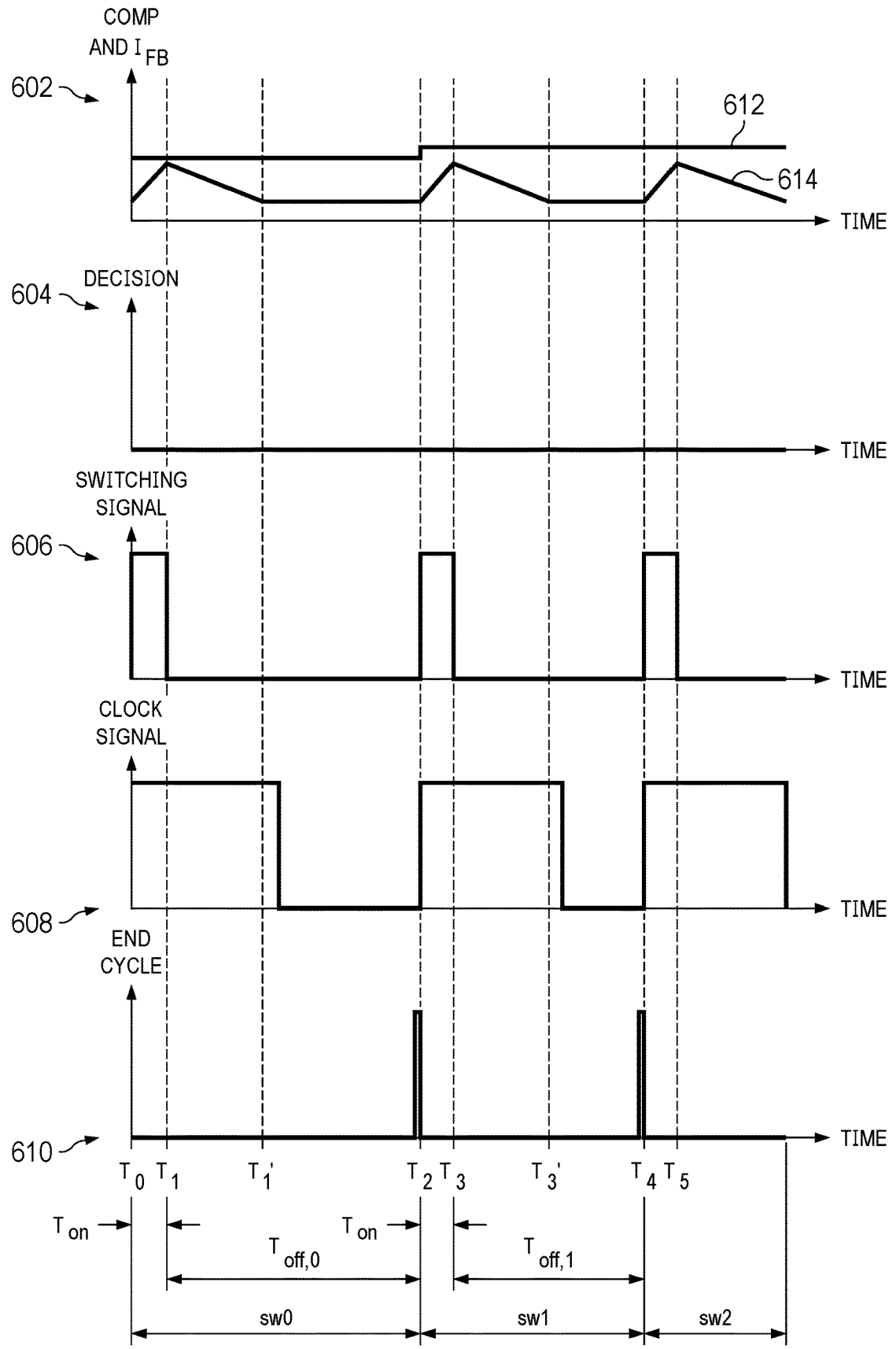

FIG. 6 includes waveform graphs that illustrate example operations of power supply system 400 in PFM mode. FIG. 6 includes graphs 602, 604, 606, 608, and 610. Graph 602 includes a plot 612 of COMP signal 424 and a plot 614 of $I_{FB}$ signal 422 with respect to time. Both COMP signal 424 and $I_{FB}$ signal 422 are represented as voltages in graph 602. Also, graph 606 is a plot of switching signal 114 with respect to time, graph 608 is a plot of clock signal 434 with respect to time, and graph 610 is a plot of end cycle signal 432. In FIG. 6, two complete switching cycles sw0 and sw1 and part of a switching cycle sw2 are illustrated.

Referring to FIG. 6, in PFM mode, both COMP signal 424 and $I_{FB}$ signal 422 can be below the minimum input level of comparator 406, and decision signal 426 can remain static in PFM mode. Also, clock generation circuit 410 can generate a clock signal 434 using trigger-based signal generator 410b, with the clock cycle frequency and the switching cycle frequency modulated by end cycle signal 432. Also, as decision signal 426 remains static, switching signal generation circuit 412 can reset S-R latch 340 after a pre-determined duration has elapsed from the start of the clock cycle and the switching cycle, which can lead to an identical on-time $T_{on}$ across the switching cycles.

At time $T_0$, triggered by a pulsed end cycle signal 432, a clock cycle of clock signal 434 starts, which also starts the switching cycle sw0. At time $T_0$, clock signal 434 has an asserted state and can set the output (Q) of S-R latch 340 to start the on-time $T_{on,0}$ of switching cycle sw0. Within the on-time $T_{on}$, inductor 104 can be in a charging state, and the inductor current starts to increase. The on-time $T_{on}$ of switching cycle sw0 ends at $T_1$ when switching signal generation circuit 412 resets S-R latch 340, and the off-time of the switching cycle $T_{off,0}$ starts. Within $T_{off,0}$, the inductor current drops and reaches the minimum value at $T_1'$.

Switching frequency modulation circuit 408 can generate a pulsed end cycle signal 432 at time $T_2$ based on the magnitude of COMP signal 424 within switching cycle sw0, and the switching cycle sw0 ends at $T_2$. As to be described below, switching frequency modulation circuit 408 can adjust the timing of end cycle signal 432 based on the magnitude of COMP signal 424 to modulate the off-time $T_{off,0}$ and the cycle period of switching cycle sw0. End cycle signal 432 can also trigger a new clock cycle in clock signal 434 at time $T_2$, which starts the subsequent switching cycle sw1 and its on-time $T_{on}$. The on-time $T_{on}$ of switching cycle sw1 ends at $T_3$ when switching signal generation circuit 412 resets S-R latch 340, and the off-time of the switching cycle $T_{off,1}$ starts. Within $T_{off,1}$, the inductor current drops and reaches the minimum value at T3'.

Switching frequency modulation circuit 408 can generate a pulse at time $T_4$ based on COMP signal 424 within switching cycle sw1, and the switching cycle sw1 ends at $T_4$. As COMP signal 424 increases in switching cycle sw1 with respect to switching cycle sw0, switching frequency modulation circuit 408 can pull in end cycle signal 432 and reduce the off-time $T_{off,1}$ of switching cycle sw1 with respect to $T_{off,0}$. As the off-time and the cycle period of switching cycle sw1 reduce with respect to switching cycle sw0, the average current supplied to load 110 can increase in switching cycle sw1 with respect to sw0. The pulsed end cycle signal 432 at time $T_4$ can also trigger a new clock cycle in clock signal 434, which starts the subsequent switching cycle sw2 and its on-time $T_{on}$.

Figure 7:
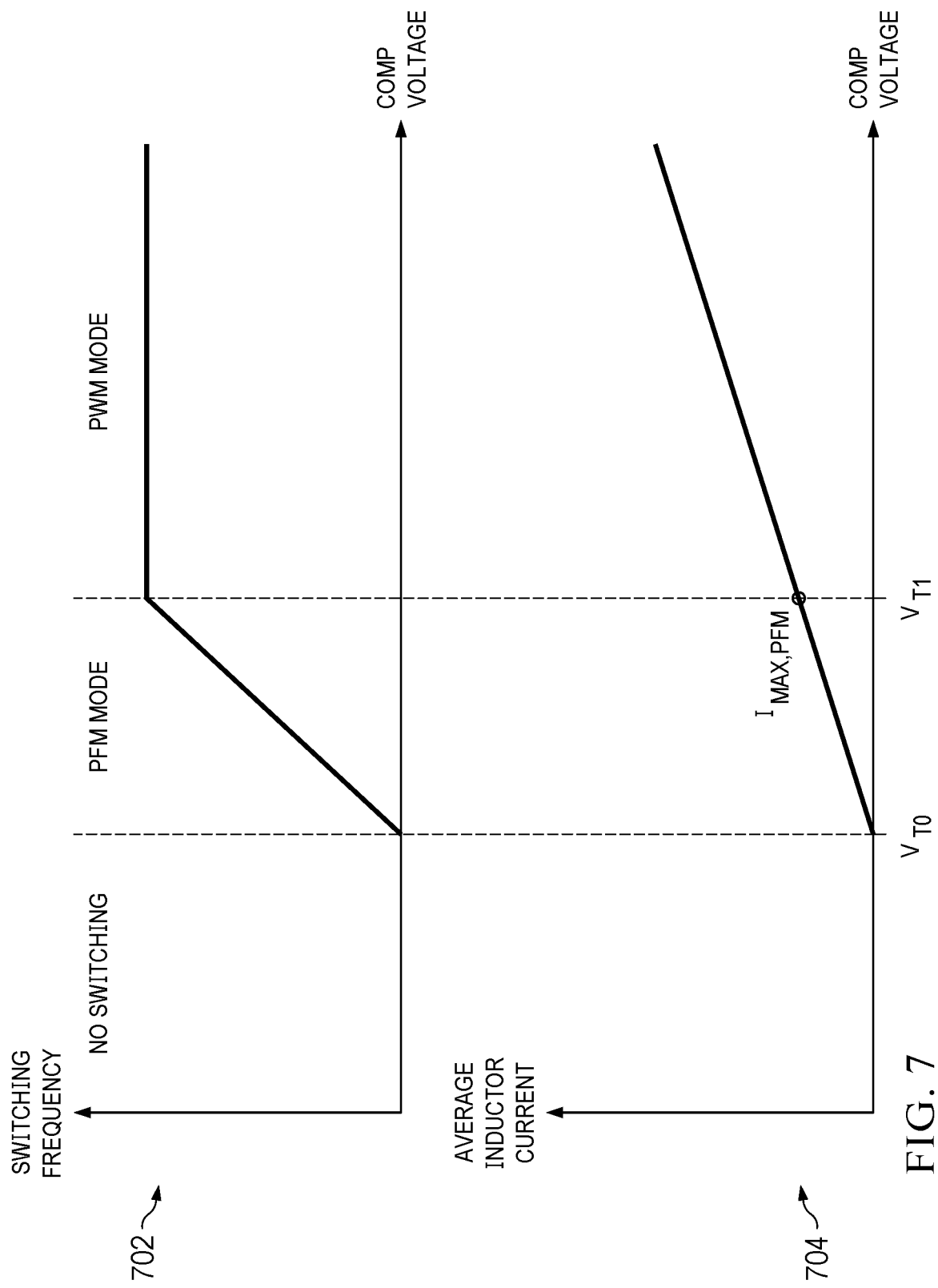

As described above, controller 402 (and frequency modulator circuit 308) can determine whether to operate SMPS 100 in the PFM mode or in the PWM mode based on the magnitude of COMP signal 424. FIG. 7 illustrates example operations of power supply system 400 based on the magnitude of COMP signal 424 (labelled "COMP voltage" in FIG. 7). In FIG. 7, graph 702 illustrates the variation of switching frequency with respect to COMP signal 424, and graph 704 illustrates the variation of average inductor current with respect to COMP signal 424.

Referring to graphs 702 and 704, if COMP signal 424 is below a first threshold voltage $V_{T0}$, controller 402 can set the switching frequency to zero. As described above, COMP signal 324 can represent a target peak current demanded by load 110. COMP signal 424 being below $V_{T0}$ can indicate that load 110 can be in a standby condition and does not need power transfer from power source 106. Accordingly, with zero switching frequency, controller 402 can stop the charging and the discharging of inductor 104, and the average inductor current can be at zero. The average current provided by SMPS 100 to load 110 can also be zero. In some examples, first threshold voltage $V_{T0}$ can be equal to or close to zero.

If COMP signal 424 is between first threshold voltage $V_{T0}$ and a second threshold voltage $V_{T1}$, controller 402 can control SMPS 100 in the PFM mode, in which controller 402 sets the switching frequency based on the magnitude of COMP signal 424. For example, as the magnitude of COMP signal 424 increases, controller 402 can increase the switching frequency (by reducing the switching cycle period) to increase the average inductor current supplied to load 110. Also, as the magnitude of COMP signal 424 decreases, controller 402 can reduce the switching frequency to reduce the average inductor current supplied to load 110. SMPS 100 can provide the maximum average current within PFM mode (labelled $I_{MAX,PFM}$ in graph 704) when COMP signal 424 is at the second threshold voltage $V_{T2}$, and can provide zero average current when COMP signal 424 is at or below the first threshold voltage $V_{T1}$.

If COMP signal 424 is above the second threshold voltage $V_{T2}$, controller 402 can control SMPS 100 in the PWM mode, in which controller 402 keeps the switching frequency constant and sets the on-time of the switching cycles based on the magnitude of COMP signal 424. For example, as the magnitude of COMP signal 424 increases, controller 402 can increase the on-time of the switching cycles to increase the peak inductor current, which also increase the average inductor current supplied to load 110. Also, as the magnitude of COMP signal 424 decreases, controller 402 can reduce the on-time to reduce the peak inductor current as well as the average inductor current supplied to load 110.

In the example operations illustrated in FIG. 7, PFM and PWM operations can be associated with separate COMP voltage ranges. Such arrangements can reduce the likelihood of controller 402 switching between PFM and PWM modes, or operating in both PFM and PWM modes at the same time, due to small perturbations in COMP signal 424. This can improve the stability of power supply system 400 and reduce oscillation. Also, the COMP voltage range for PFM, between threshold voltages $V_{T0}$ and $V_{T1}$, can be configured such that a uniform and linear relationship between the average inductor current and COMP signal 424 can be maintained throughout the PFM and PWM operations. Compared with a case where the inductor current increases with COMP signal 424 at a higher rate in PFM mode than in PWM mode due to a small COMP voltage range between $V_{T0}$ and $V_{T1}$, the arrangements of FIG. 7 can further improve the stability of power supply system 400 and reduce oscillation. The uniform and linear relationship between the average inductor current and COMP signal 424 throughout the PFM and PWM operations can also improve the stability of the feedback system and reduce noise in the output voltage and current during the transition between PFM and PWM modes.

As described above, the second threshold voltage $V_{T1}$ can define a boundary between PFM and PWM modes of operations. The second threshold voltage $V_{T1}$ can be configured based on the mechanism employed by controller 402 to switch between PFM and PWM modes of operations. For example, referring back to FIG. 4, the negative input of comparator 406 can be directly coupled to the output of amplifier 404 to receive COMP signal 424, and controller 402 can operate in PFM mode if COMP signal 424 is below a minimum input level for comparator 406 to compare COMP signal 424 and $I_{FB}$ signal 422 to generate decision signal 426. In such an example, the second threshold voltage $V_{T1}$ can be configure based on the minimum input level.

Figure 8:
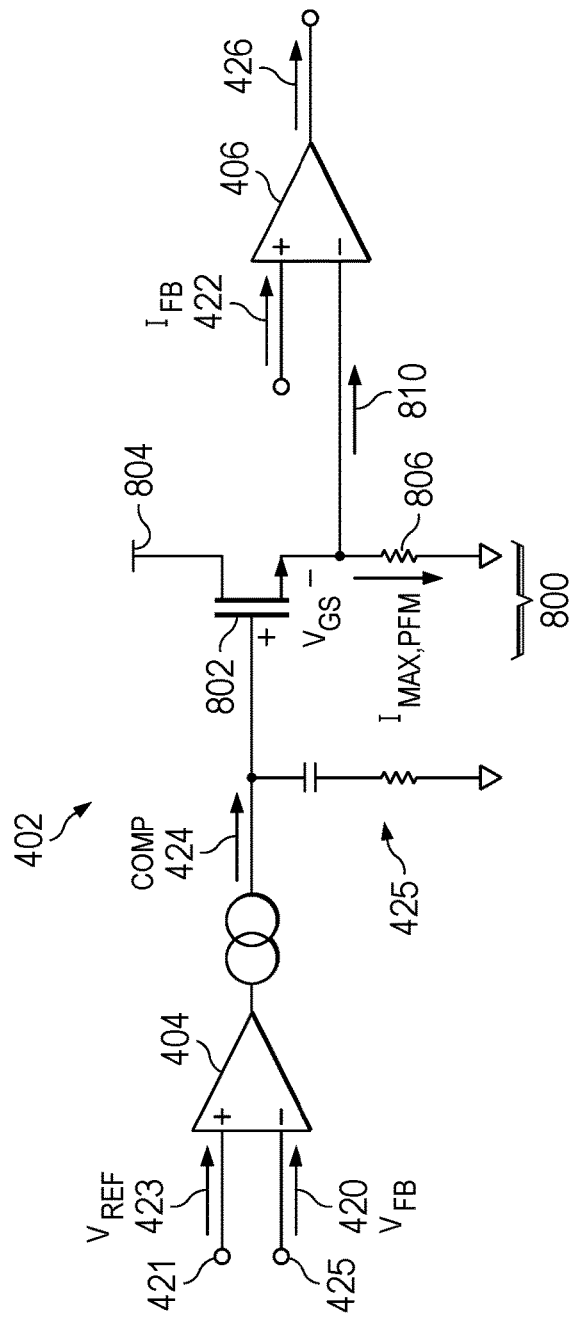
FIG. 8 is a schematic of components of the power supply system of FIG. 4 to support transition between PWM and PFM mode.

FIG. 8 is a schematic of example components of controller 402 to support transition between PFM and PWM modes of operations. Referring to FIG. 8, controller 402 can include a voltage buffer 800 coupled between the output of amplifier 404 and the negative input of comparator 406. Voltage buffer 800 can include a transistor 802, which can be a field effect transistor (FET), having a control terminal (e.g., gate) coupled to the output of amplifier 404, a first current terminal (e.g., drain) coupled, either directly, or indirectly, to a power supply 804, and a second current terminal (e.g., source) coupled to a bias resistor 806, and transistor 802 can be configured as a source follower. Voltage buffer 800 can provide a buffer signal 810 at the second current terminal. In some examples, transistor 802 can be a bipolar junction transistor (BJT) and can be configured as an emitter follower.

Controller 402 can determine whether to operate in PFM or PWM modes based on whether transistor 802 is enabled, which allows buffer signal 810 to track COMP signal 424. For example, if COMP signal 424 is below a threshold $V_{GS}$ voltage to enable transistor 802, transistor 802 may become disabled and do not conduct a current through bias resistor 806. Buffer signal 810 can be zero and do not track COMP signal 424. Accordingly, controller 402 can operate in the PFM mode. In contrast, if COMP signal 424 exceeds the requisite $V_{GS}$ voltage, transistor 802 can be enabled and conduct a current through bias resistor 806 that reflects the magnitude of COMP signal 424. In some example, this current can be scaled and compared against COMP signal 422 to control the inductor current. In some examples, one of buffer signal 810 or COMP signal 424 can be used to control the inductor current as they are all related by the $V_{GS}$ voltage of transistor 802. Also, COMP signal 424 can be proportional to the average current provided to load 110 in a switching cycle. In the example of FIG. 8, the second threshold voltage $V_{TH1}$ can be equal to the threshold $V_{GS}$ voltage for transistor 802 to conduct a current equal to (or a scaled version of) the maximum average current provided to load 110 in the PFM mode ($I_{MAX,PFM}$ in FIG. 7). With such arrangements, the second threshold voltage $V_{TH1}$ can represent the maximum voltage of COMP signal 424 for controller 402 to operate in the PFM mode.

Figure 9:
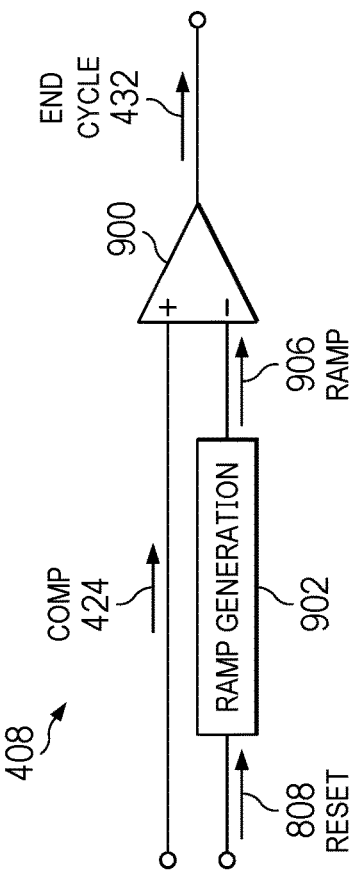
FIG. 9 is a schematic of a switching frequency modulation circuit of the power supply system of FIG. 4.

FIG. 9 is a schematic of an example of switching frequency modulation circuit 408. Referring to FIG. 9, switching frequency modulation circuit 408 can include a comparator 900 and a ramp generation circuit 902. A first comparator input (e.g., a positive input) of comparator 900 can be coupled to the output of amplifier 404 to receive COMP signal 424, and a second comparator input (e.g., a negative input) of comparator 900 can be coupled to ramp generation circuit 902 to receive a ramp signal 906.

In some examples, ramp signal 906 can include a time-varying voltage signal that decreases from the second threshold voltage $V_{T1}$ to the first threshold voltage $V_{T0}$ within a switching cycle in the PFM mode. While ramp signal 906 decreases with time, comparator 900 can compare between COMP signal 424 and ramp signal 906 to generate a decision signal. If COMP signal 424 intersects with ramp signal 906, comparator 900 can trip, and the decision signal and end cycle signal 432 can switch state. The switching of the state of end cycle signal 432 can signal the end of the off-time of a current switching cycle. As the timing of intersection between COMP signal 424 and ramp signal 906 depends on the voltage of COMP signal 424, the end time of a switching cycle also depends on the voltage of COMP signal 424. Accordingly, switching frequency modulation circuit 408 can modulate the switching frequency based on the voltage of COMP signal 424 to operate in the PFM mode similar to as shown in graph 702 of FIG. 7.

Figure 10:
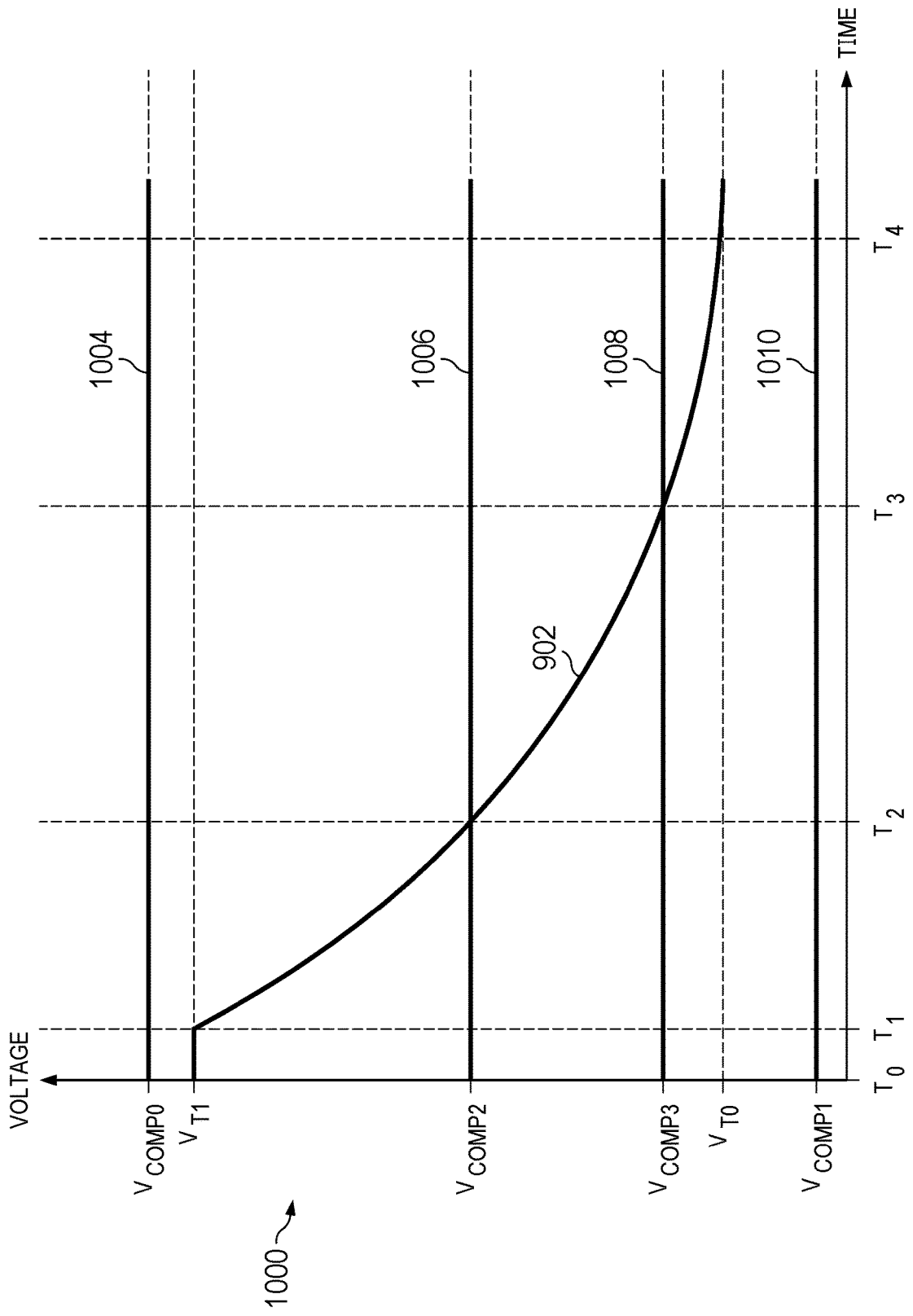
FIG. 10 is a waveform graph of example operations of the switching frequency modulation circuit of FIG. 9.

FIG. 10 includes a waveform graph 1000 that illustrates example operations of switching frequency modulation circuit 408. Graph 1000 includes a plot 1002 of ramp signal 906, and plots 1004, 1006, 1008, and 1010 of COMP signal 424 having different voltage levels. Referring to FIG. 10, ramp generation circuit 902 can initially set the voltage of ramp signal 906 at $V_{T1}$ responsive to reset signal 908 between times $T_0$ and $T_1$. In some examples, switching frequency modulation circuit 408 can receive switching signal 114, and generate reset signal 908 based on the on-time of switching signal 114. For example, reset signal 908 can be in an asserted state (e.g., logical one) during the on-time of a switching cycle of switching signal 114, and can be in the de-asserted state (e.g., logical zero) when the on-time ends and the off-time starts at $T_1$.

After $T_1$, responsive to reset signal 908 being in the de-asserted state, ramp generation circuit 902 can decrease the voltage of ramp signal 906 with time to generate ramp signal 906. As to be described below, in some examples, ramp generation circuit 902 can include a capacitor. Ramp generation circuit 902 can generate ramp signal 906 by charging and discharging the capacitor, and when the capacitor discharges, the voltage of ramp signal 906 can decrease with time following an exponential decay function. In some examples, ramp generation circuit 902 can include a digital-to-analog converter (DAC) circuit to generate ramp signal 906. In such examples, ramp generation circuit 902 can generate ramp signal 906 based on a pattern of digital values supplied by a sequential logic circuit, such as a finite state machine (FSM), a counter, etc.

Comparator 900 can compare ramp signal 906 with COMP signal 424. Ramp signal 906 may be initially higher than COMP signal 424 at $T_1$, and end cycle signal 432 can be at the de-asserted state at $T_1$. As ramp signal 906 decreases with time, if ramp signal 906 intersects with COMP signal 424, comparator 900 can trip, and end cycle signal 432 can switch from the de-asserted state to the asserted state as a result of the intersection and ends the off-time of the switching cycle. When the intersection occurs and a new switching cycle starts, ramp generation circuit 902 can receive an asserted reset signal 908 again to bring ramp signal 906 back to $V_{T1}$. Also, end cycle signal 432 can switch back to the de-asserted state, as ramp signal 906 becomes higher than COMP signal 424 again, thereby resulting in a pulsed end cycle signal as depicted in FIG. 6.

The timing of the intersection can reflect the magnitude of COMP signal 424. For example, COMP signal 424 having a voltage $V_{COMP2}$ intersects with ramp signal 906 at $T_2$, and COMP signal 424 having voltage $V_{COMP3}$ intersects with ramp signal 906 at $T_3$. As $V_{COMP2}$ is higher than $V_{COMP3}$, the intersection for $V_{COMP2}$ (T2) happens earlier than for $V_{COMP3}$ (T3) with respect to T1 when the off-time starts and reset signal 908 is de-asserted. Accordingly, the off-time of a switching cycle ends earlier $V_{COMP2}$ than $V_{COMP3}$, which can lead to the switching cycle period being reduced and the switching frequency being increased.

Also, intersection between COMP signal 424 and ramp signal 906 may not occur if the voltage of COMP signal 424 is outside the voltage range between $V_{T0}$ and $V_{T1}$ (e.g., $V_{COMP0}$ and $V_{COMP1}$). In such cases, ramp signal 906 can decrease to $V_{T0}$ at time $T_4$, which can represent the end of a maximum off-time of a switching cycle in the PFM mode. If COMP signal 424 exceeds $V_{T1}$ (e.g., $V_{COMP0}$), Controller 402 can Operate in the PWM Mode, where Comparator 900 can Output a static end cycle signal 432 in the asserted state. In response, clock generation circuit 410 can provide clock signal 434 having a constant switching frequency using oscillator 410a. Also, if COMP signal 424 is below $V_{T0}$ (e.g., $V_{COMP1}$), comparator 900 can output a static end cycle signal 432 in the de-asserted state. In response, clock generation circuit 410 can stop oscillator 410a and trigger-based signal generator 410b from providing clock signal 434 to stop the switching.

Figure 11:
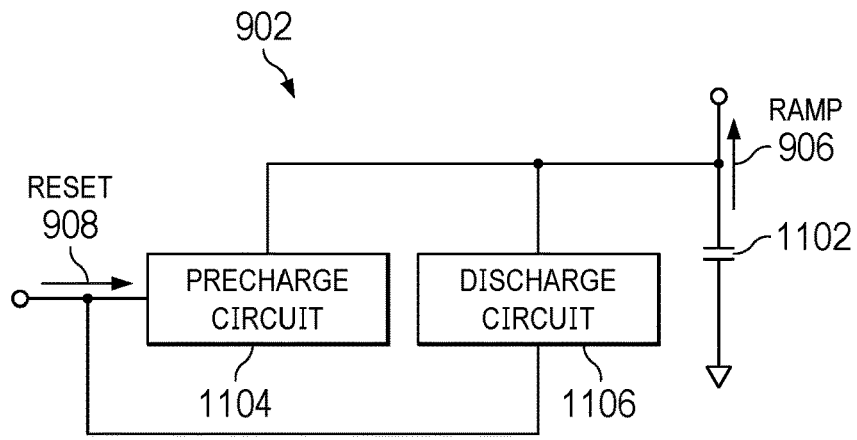
FIGS. 11 through 15 are schematics of components of the switching frequency modulation circuit of FIG. 9.

FIG. 11 is a schematic of an example ramp generation circuit 902. As shown in FIG. 11, ramp generation circuit 902 can include a capacitor 1102, a precharge circuit 1104, and a discharge circuit 1106. A top plate of capacitor 1102 can be coupled to precharge circuit 1104 and discharge circuit 1106, and the bottom plate of capacitor 1102 can be coupled to ground. The top plate of capacitor 1102 can provide a voltage for ramp signal 906. Both precharge circuit 1104 and discharge circuit 1106 can receive and be controlled by reset signal 908. Responsive to the reset signal 908 being in a first state (e.g., a logical one), precharge circuit 1104 can charge capacitor 1102 and set a maximum voltage of the top plate at the second threshold voltage $V_{TH1}$. Responsive to the reset signal 908 being in a second state (e.g., a logical zero), discharge circuit 1106 can discharge capacitor 1102, and the voltage of the top plate can decrease with time. Discharge circuit 1106 can also set a minimum voltage of the top plate to the first threshold voltage $V_{TH0}$.

Figure 12:
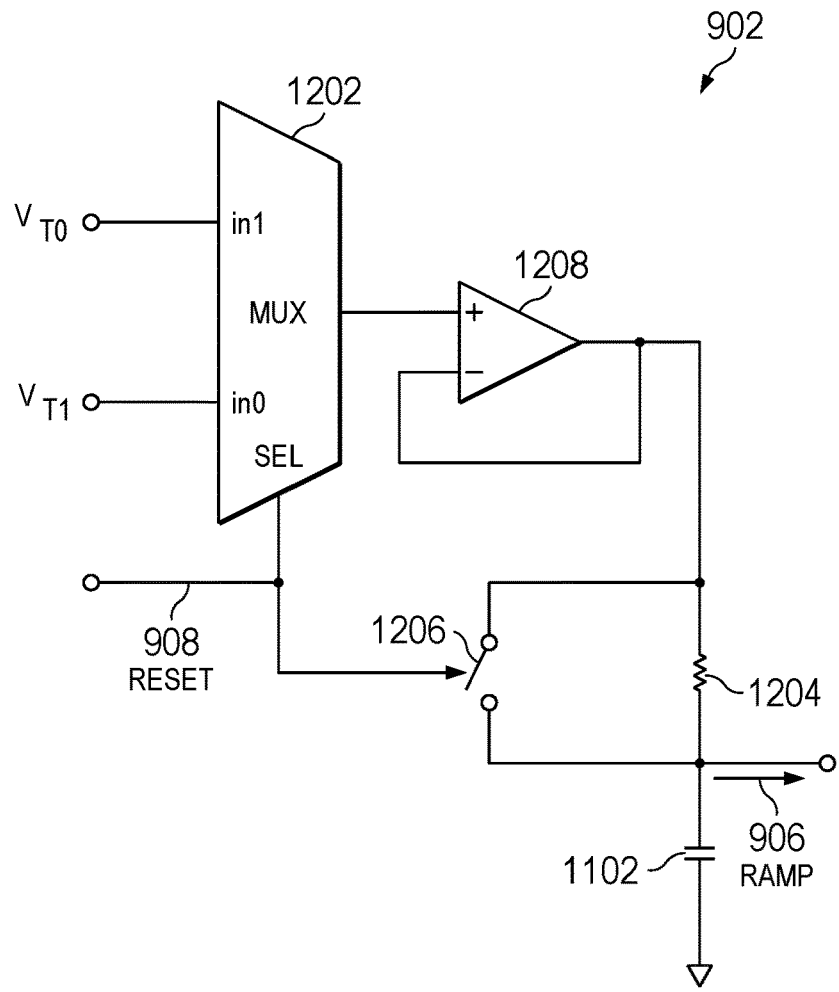

FIG. 12 is a schematic of an example generation circuit 902. Referring to FIG. 12, ramp generation circuit 902 can include a multiplexor 1202, a resistor 1204, and a switch 1206 in addition to capacitor 1102. Multiplexor 1202 can have a first voltage input (labelled "in0") to receive first threshold voltage $V_{T0}$ and a second voltage input (labelled "in1") to receive second threshold voltage $V_{T1}$. The first and second voltage inputs can be coupled to voltage sources (not shown in FIG. 12) to receive the threshold voltages. Multiplexor 1202 can also have a selection input (labelled "SEL") to receive reset signal 908. The output of multiplexor can be coupled to one terminal of resistor 1204, and the other terminal of resistor 1204 can be coupled to the top plate of capacitor 1102. Switch 1206 (e.g., a transistor) can be coupled across resistor 1204 and controlled by reset signal 908. In some examples, ramp generation circuit 902 may also include a clamping circuit, such as a voltage regulator 1208, coupled between the multiplexor output and resistor 1204.

In FIG. 12, switch 1206 can be part of precharge circuit 1104, and resistor 1204 can be part of discharge circuit 1106. Responsive to reset signal 908 being in a first state (e.g., a logical one), switch 1206 can be enabled, and multiplexor 1202 and switch 1206 can connect the top plate of capacitor 1102 to the voltage source that provides the second threshold voltage $V_{T1}$ to charge the capacitor. The top plate of capacitor 1102 can therefore be set to the voltage of $V_{T1}$. Also, responsive to reset signal 908 being in a second state (e.g., a logical zero), switch 1206 can be disabled, and multiplexor 1202 and resistor 1204 can connect the top plate of capacitor 1102 to the voltage source that provides the first threshold voltage $V_{T0}$ to discharge the capacitor. This allows the top plate voltage of capacitor 1102 to drop with time towards the first threshold voltage $V_{T0}$. The resistance of resistor 1204 and the capacitance of capacitor 1102 can determine the RC time constant and the rate of decrease of ramp signal 906. In some examples, the resistance of resistor 1204 and the capacitance of capacitor 1102 can be chosen such that the RC time constant is a fraction of the maximum switching cycle period under the PFM mode, to allow ramp signal 906 to settle to the first threshold voltage $V_{T0}$ before the switching cycle period ends.

Figure 13:
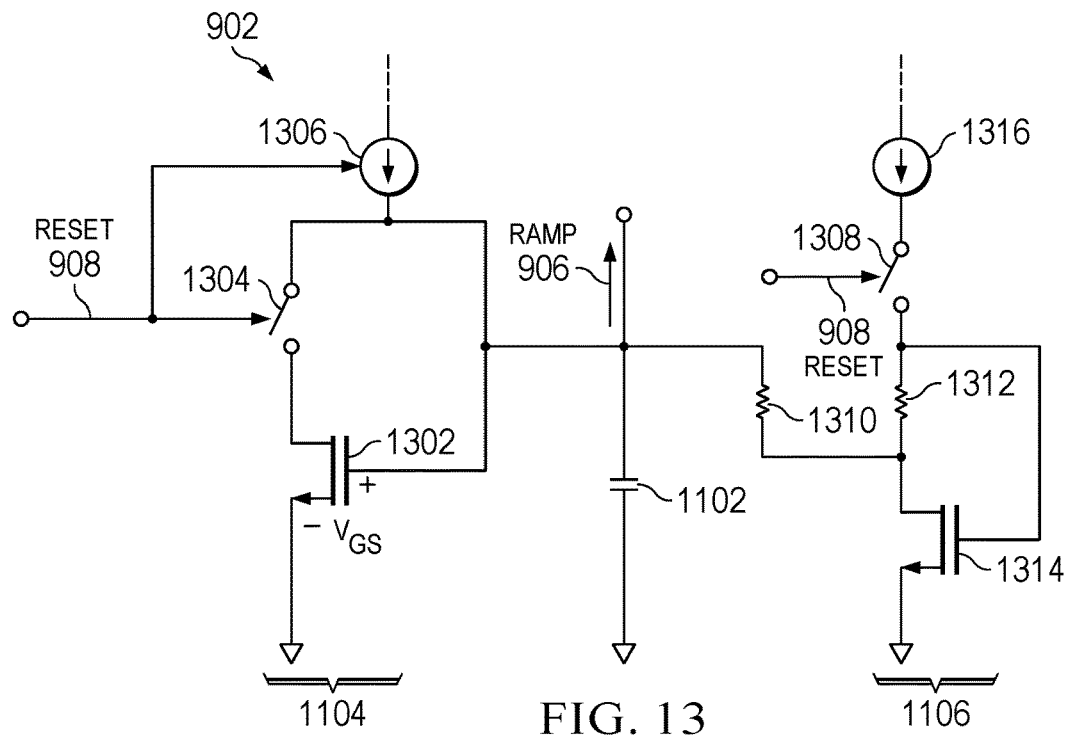

FIG. 13 is a schematic of another example ramp generation circuit 902. In FIG. 13, precharge circuit 1104 can include a transistor 1302, a switch 1304 (which can also be a transistor), and a switchable current source 1306. Switch 1304 can be coupled between a control terminal (e.g., gate) and a first current terminal (e.g., a drain) of transistor 1302, and a second current terminal (e.g., drain) of transistor 1302 can be coupled to ground. Switch 1304 can also be coupled between current source 1306 and the first current terminal of transistor 1302 and can be controlled by reset signal 908. The control terminal of transistor 1302 can also be coupled to the top plate of capacitor 1102. Responsive to reset signal 908 being in a first state (e.g., a logical one), switch 1304 and current source 1306 can be enabled, and transistor 1302 can form a diode to conduct a current provided by current source 1306. The $V_{GS}$ voltage across transistor 1302 can provide the second threshold voltage $V_{TH1}$, and current source 1306 can set the voltage of the top plate of capacitor 1102 to $V_{TH1}$.

In some examples, current source 1306, together with transistor 1302, can be configured such the second threshold voltage $V_{TH1}$ equals the threshold $V_{GS}$ voltage that enables transistor 802 of FIG. 8 to transmit COMP signal 424. For example, as described above in FIG. 8, the second threshold voltage $V_{TH1}$ can be equal to the threshold $V_{GS}$ voltage for transistor 802 to conduct a current equal to (or scaled from) the maximum average current provided to load 110 in the PFM mode ($I_{MAX,PFM}$). To provide such a $V_{TH1}$, current source 1306 can be configured to provide a current equal to $I_{MAX,PFM}$, and transistor 1302 can be matched with transistor 802 (such as having the same width, same length, same threshold voltage to enable the transistor, etc.), such that when transistor 1302 conducts a $I_{MAX,PFM}$ current the $V_{GS}$ voltage across transistor 1302 can be equal (or at least similar) to the threshold $V_{GS}$ voltage that enables transistor 802 to also conduct the $I_{MAX,PFM}$ current. In some examples, the width and length of 1302 can be scaled so that its $V_{GS}$ can be equal to a specific second threshold voltage $V_{TH1}$ for a specific current provided by current source 1306.

Also, discharge circuit 1106 can include a resistor 1310, a resistor 1312, a transistor 1314, and a switchable current source 1316. Resistor 1310 can be coupled between the top plate of capacitor 1102 and a first current terminal (e.g., drain) of transistor 1314, and a second current terminal (e.g., source) of transistor 1314 can be coupled to a ground. Also, resistor 1312 can be coupled between the first current terminal and current source 1316. A control terminal (e.g., gate) of transistor 1314 can also be coupled to current source 1316, and resistor 1312 can be coupled between the control terminal and the first current terminal. Responsive to reset signal 908 being in a second state (e.g., a logical zero), switch 1308 and current source 1316 can be enabled to conduct a current from current source 1316 to transistor 1314 via resistor 1312, and transistor 1314 can also be enabled. Switch 1304 and current source 1306 can be disabled by the reset signal 909 in the second state. This allows capacitor 1102 to discharge via resistor 1310 and transistor 1314, and the minimum voltage of the top plate of capacitor 1102 (e.g., first threshold voltage $V_{TH0}$) can be set by the voltage at the first current terminal of transistor 1314. The resistance of resistor 1310 and the capacitance of capacitor 1102 can also set the RC time constant and the rate of decrease of ramp signal 906. The voltage at the first current terminal (and the first threshold voltage $V_{TH0}$) can be based on the $V_{GS}$ of transistor 1314 and the voltage drop across resistor 1312 as follows:

$$V_{TH0} = V_{GS,1314} - I_{1316} \times R_{1312} \quad \text{(Equation 1)}$$

In Equation 1, $V_{GS,1314}$ can represent the $V_{GS}$ voltage of transistor 1314, $I_{1316}$ can represent the current provided by current source 1316, and $R_{1312}$ can represent the resistance of resistor 1312. In some examples, current source 1316 can be configured to provide the $I_{MAX,PFM}$ current, and transistor 1314 can be matched with transistor 1302 and transistor 802, such that $V_{GS,1314}$ can be equal to the threshold $V_{GS}$ voltage that enables transistor 802 to also conduct the $I_{MAX,PFM}$ current (or a scaled version of $I_{MAX,PFM}$ current).

Figure 14:
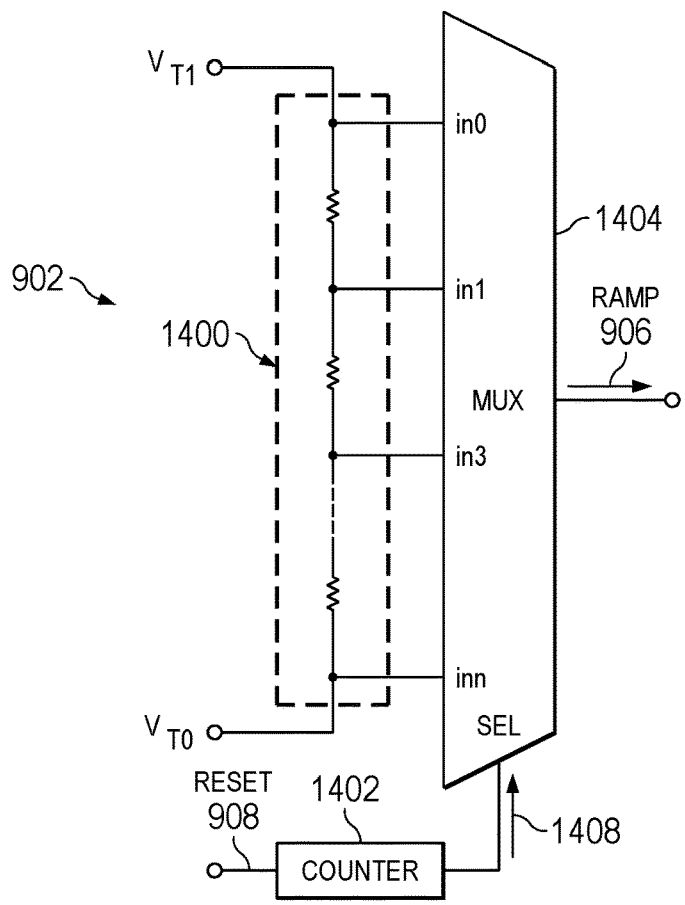

FIG. 14 is a schematic of another example ramp generation circuit 902. Referring to FIG. 14, ramp generation circuit 902 can include a voltage divider 1400, a counter 1402, and a multiplexor 1404. Voltage divider 1400 can include a network of resistors and coupled between two voltage sources to receive the first threshold voltage $V_{TH0}$ and the second threshold voltage $V_{TH1}$. Voltage divider 1400 can include multiple tap points to provide multiple voltages between $V_{TH0}$ and $V_{TH1}$. Multiplexor 1404 can have multiple inputs (such as in0, in1, ... inn) each coupled to a tap point of voltage divider 1400 to receive the multiple voltages, and a selection input (SEL) to receive a selection signal 1408. The output of multiplexor 1404 can provide ramp signal 906. Based on selection signal 1408, multiplexor 1404 can select one of the voltages provided by voltage divider 1400 as ramp signal 906. Counter 1402 can provide a digital value as selection signal 1408. Upon being reset, counter 1402 can output a digital value to select the second threshold voltage $V_{TH1}$ as ramp signal 906. After counter 1402 is released from the reset, it can generate a pattern of digital values that monotonically increase or decrease with time, which allows multiplexor 1404 to select monotonically decreasing voltages from voltage divider 1400 as ramp signal 906. The minimum voltage selected by multiplexor 1404 as ramp signal 906 can be the first threshold voltage $V_{TH0}$.

Figure 15:
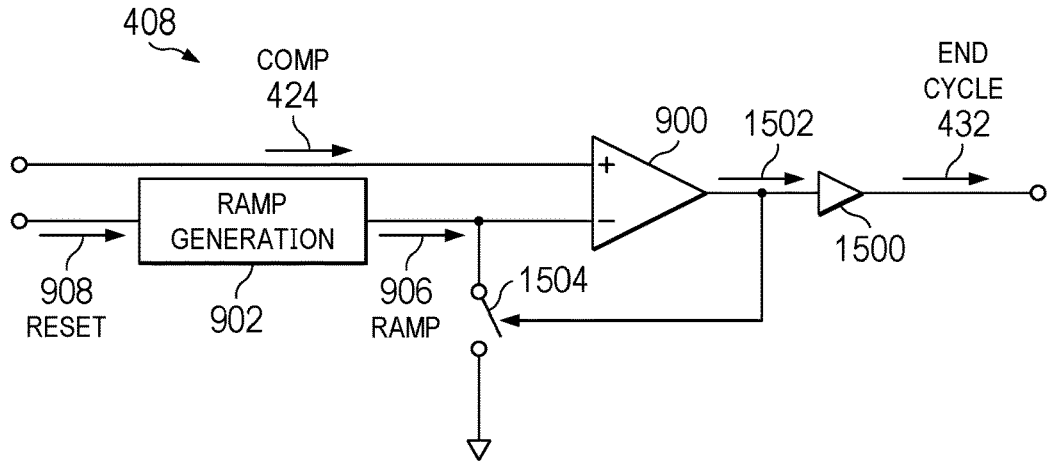

FIG. 15 is a schematic of an example switching frequency modulation circuit 408. Referring to FIG. 15, in some examples, switching frequency modulation circuit 408 can include a voltage buffer 1500 coupled at the output of comparator 900. Voltage buffer 1500 can include, for example, multiple inverter circuits to generate end cycle signal 432 by buffering a decision signal 1502 provided by comparator 900 when comparing COMP signal 424 with ramp signal 906. Such arrangements can increase the edge rate of end cycle signal 432, which can improve the accuracy in modulating the switching frequency.

In some examples, switching frequency modulation circuit 408 can include a trip predictor circuit 1504. Trip predictor circuit 1504 can include a switch (e.g., a transistor) coupled between the negative input and the output of comparator 900. Trip predictor circuit 1504 can speed up the transition of decision signal 1502 by predicting that comparator 900 is on the verge of tripping. Based on the prediction, trip predictor circuit 1504 can pull down the negative input to ground to speed up the transition of decision signal 1502. In some examples, the switch of trip predictor circuit 1504 can have a lower turn-on threshold voltage than the trip point of buffer 1500, which allows the switch to be turned on before buffer 1500 starts to trip. In some examples, trip predictor circuit 1504 can be part of buffer 1500, where buffer 1500 can include a latch circuit to generate end cycle signal 432 from decision signal 1502. All these arrangements can reduce the shoot-through/quiescent current in buffer 1500 during the transition of decision signal 1502, while increasing the edge rate of end cycle signal 432.

Figure 16:
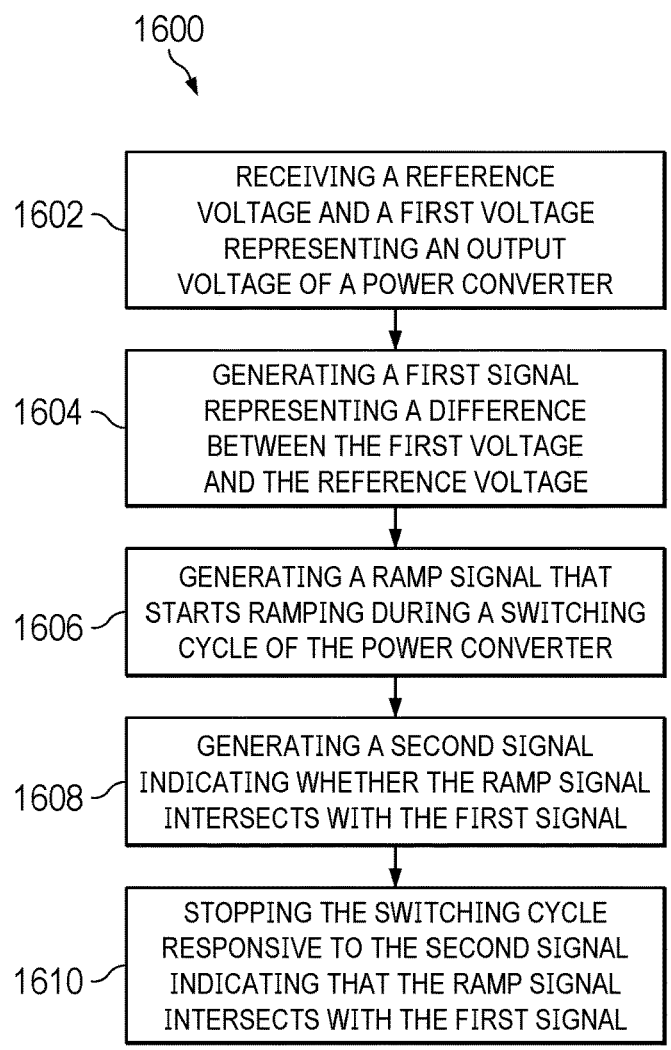
FIG. 16 is a flow chart of a process for controlling an SMPS.

FIG. 16 is a flowchart of an example method 1600 of controlling a power converter, such as SMPS 100 of FIG. 1. Method 1600 can be performed by a controller, such as controller 402.

In step 1602, the controller can receive a reference voltage and a first voltage representing an output voltage of the power converter. The controller can receive the first voltage from a voltage feedback circuit (e.g., voltage feedback circuit 416) that generates the first voltage as a scaled version of the output voltage. The reference voltage can represent a target for the first voltage.

In step 1604, the controller can generate a first signal representing a difference between the first voltage and the reference voltage. For example, the controller can include an amplifier, such as amplifier 404, that can generate a signal (e.g., COMP signal 424) that represents a difference between the first voltage and the reference voltage.

In step 1606, the controller can generate a ramp signal that starts ramping within a switching cycle of the power converter.

Specifically, the controller can include a switching frequency modulation circuit (e.g., switching frequency modulation circuit 408), which can include a ramp generation circuit, such as ramp generation circuit 902, to generate the ramp signal (e.g., ramp signal 906). The ramp signal can decrease monotonically from a first voltage (e.g., $V_{TH1}$) to a second voltage (e.g., $V_{TH0}$) within the switching cycle. The first and second voltages can represent a range of the first signal for which the controller is to control the power converter in the PFM mode. The controller can first reset the ramp generation circuit within the switching cycle, such as when the on-time of the switching cycle ends, and the ramp generation circuit can provide the first voltage as the ramp signal. After the reset is released, the ramp generation circuit can decrease the voltage of the ramp signal towards the first voltage.

The ramp generation circuit can decrease the voltage of the ramp signal using various techniques. For example, as shown in FIGS. 11 through 13, the ramp generation circuit can include a capacitor to provide the ramp signal, and the ramp generation circuit can decrease the voltage of the ramp signal with time by discharging the capacitor within the switching cycle. As another example, as shown in FIG. 14, the ramp generation circuit can include a voltage divider providing multiple voltages between the first voltage and the second voltage, and the ramp generation circuit can select different voltages from the voltage divider within the switching cycle.

In step 1608, the controller can generate a second signal indicating whether the ramp signal intersects with the first signal. Specifically, switching frequency modulation circuit 408 can include a comparator (e.g., comparator 900) to compare the first signal and the ramp signal to generate a decision. The decision can provide the second signal, such as end cycle signal 432. As the ramp signal drops with time, if the ramp signal intersects the first signal, comparator 900 can trip, and the decision can switch state, and the switching of the decision can indicate that ramp signal intersects the first signal. The intersection can indicate that the first signal (COMP signal 424) is within the range for PFM operation, and the timing of the switching (e.g., with respect to the start of the ramp signal) can reflect the magnitude of the first signal.

In step 1610, the controller can stop the switching cycle responsive to the second signal indicating that the ramp signal intersects with the first signal. Specifically, switching frequency modulation circuit 408 can transmit end cycle signal 432 to a switching signal generation circuit (e.g., switching signal generation circuit 412). If the second signal (e.g., end cycle signal 434) switches state, which indicates the ramp signal intersects the first signal and the power converter is to be operated in the PFM mode, the switching signal generation circuit can stop the current switching cycle and start a new switching cycle. By stopping the current switching cycle based on the switching of end cycle signal 432, the current cycle period, as well as the switching frequency, can also be modulated based on the magnitude of COMP signal 424.

Steps 1602 through 1610 can be part of a PFM mode of operation, for which COMP signal 424 is within the range of the PFM operation (between first threshold voltage $V_{T0}$ and second threshold voltage $V_{T1}$) and intersects with ramp signal 906. If the ramp signal does not intersect with the first signal, this can indicate that the first signal is outside the range of the PFM operation. If the first signal is below $V_{TH0}$, which can be represented by a static second signal having a de-asserted state, the switching signal generation circuit can stop transmitting switching signals to the power converter to stop the switching. Also, if the first signal is above Van, which can be represented by a static second signal having an asserted state, the controller can operate the power converter in the PWM mode, in which the switching signal generation circuit transmits a switching signal having a fixed switching frequency, and the controller can set the on-time of a switching cycle based on a peak current of the power converter.

The second threshold voltage $V_{T1}$ can define a boundary between the PFM and the PWM modes of operation, and the first threshold voltage $V_{T0}$ can define the boundary between switching operations (to supply a current to the load) and no switching operation (not to supply a current to the load). The second threshold voltage $V_{T1}$ can be based on the mechanism employed by the power supply system to transition between PFM and PWM mode. For example, in a case where the output of amplifier 404 is directly coupled to the input of comparator 406 (which controls the on-time in the PWM mode), the second threshold voltage $V_{T1}$ can be based on the minimum input level for comparator 406 to generate a decision to set the on-time). In a case where the output of amplifier 404 is buffered by a source follower, as shown in FIG. 8, the second threshold voltage $V_{T1}$ can be based on a threshold $V_{GS}$ for the source follower to conduct the $I_{MAX,PFM}$ current. The first threshold voltage $V_{T0}$ can be equal to zero, or otherwise can be configured such that a uniform and linear relationship between the average inductor current and COMP signal 424 can be maintained throughout the PFM and PWM operations In this description, the term "couple" may cover connections, communications or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

In this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described herein as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between identical two nodes as the single resistor or capacitor.

Uses of the phrase "ground voltage potential" in this description include a chassis ground, an Earth ground, a floating ground, a virtual ground, a digital ground, a common ground, and/or any other form of ground connection applicable to, or suitable for, the teachings of this description. In this description, unless otherwise stated, "about,"

"approximately" or "substantially" preceding a parameter means being within +/−10 percent of that parameter.

Modifications are possible in the described examples, and other examples are possible, within the scope of the claims.

What is claimed is:

1. An apparatus comprising:
an amplifier having an amplifier output and first and second amplifier inputs, the first amplifier input coupled to a reference voltage terminal, and the second amplifier input coupled to a power input terminal, wherein the first amplifier input is configured to receive a reference voltage, and the second amplifier input is configured to receive a first voltage, the amplifier is configured to generate a first signal representing a first difference between the first voltage and the reference voltage;
a switching frequency modulation circuit including:
a ramp generation circuit having a reset input and a ramp output, wherein the ramp generation circuit is configured to:
generate a ramp signal that starts ramping during a first switching cycle; and
generate a second signal indicating whether the ramp signal intersects with the first signal;
wherein the switching frequency modulation circuit is configured to generate an end cycle signal in response to the second signal indicating that the ramp signal intersects with the first signal;
a comparator having a comparator output and first and second comparator inputs, the first comparator input coupled to the amplifier output, and the second comparator input coupled to the ramp output;
a buffer having a buffer input and a buffer output, the buffer input coupled to the comparator output; and
a switch coupled to the second comparator input, a control terminal of the switch coupled to the comparator output; and
a switching signal generation circuit, wherein in response to the second amplifier input receiving a second voltage and the amplifier generating a third signal representing a second difference between the second voltage and the reference voltage, and the second difference exceeding a threshold, the switching signal generation circuit configured to set an on-time of a second switching cycle based on a peak current.

2. The apparatus of claim 1, wherein:
the reference voltage terminal is adapted to be coupled to a reference voltage source;
the power input terminal is adapted to be coupled to an output of a power converter; and
a power control terminal is adapted to be coupled to a switch of the power converter.

3. The apparatus of claim 2, wherein:
the switching signal generation circuit is configured to stop the first switching cycle responsive to the second signal indicating that the ramp signal intersects with the first signal.

4. The apparatus of claim 3, wherein the switching signal generation circuit is configured to set a frequency of switching of the power converter based on a magnitude of the difference, in which the frequency increases with the magnitude.

5. The apparatus of claim 3, wherein the ramp generation circuit is configured to:
responsive to the reset input having a first state, provide a first ramp voltage as the ramp signal; and
responsive to the reset input having a second state, provide a voltage that decreases with time from the first ramp voltage to a second ramp voltage within the switching cycle as the ramp signal.

6. The apparatus of claim 5, wherein the ramp generation circuit includes:
a voltage divider having tap points and configured to provide voltages between the first and second ramp voltages at the tap points;
a multiplexor having voltage inputs coupled to the tap points, a voltage output coupled to the ramp output, and a selection input; and
a counter having an input coupled to the reset input and a count output coupled to the selection input.

7. The apparatus of claim 5, wherein the ramp generation circuit includes:
a capacitor coupled to the ramp output;
a precharge circuit coupled to the capacitor and configured to charge the capacitor to the first ramp voltage responsive to the reset input having the first state; and
a discharge circuit coupled to the capacitor and configured to discharge the capacitor towards the second voltage responsive to the reset input having the second state.

8. The apparatus of claim 7, wherein the ramp generation circuit includes a multiplexor having a first voltage input, a second voltage input, a selection input, and a voltage output, the first voltage input coupled to a first threshold voltage source that provides the first ramp voltage, the second voltage input coupled to a second voltage threshold source that provides the second ramp voltage, the selection input coupled to the reset input, the multiplexor configured to provide the first ramp voltage at the voltage output responsive to the reset input having the first state, and to provide the second ramp voltage at the voltage output responsive to the reset input having the second state;
wherein the discharge circuit includes a resistor coupled between the voltage output and the capacitor; and
wherein the precharge circuit includes a switch coupled across the resistor, a control terminal of the switch coupled to the reset input, in which the switch is enabled responsive to the reset input having the first state and the switch is disabled responsive to the reset input having the second state.

9. The apparatus of claim 7, wherein the precharge circuit includes a first current source, a first switch, and a first transistor having a first current terminal, a second current terminal, and a first control terminal, the first switch coupled between the first current source and the first current terminal and between the first control terminal and the first current terminal, and the first control terminal coupled to the capacitor;
wherein the discharge circuit includes a second current source, a first resistor, a second resistor, a second switch, and a second transistor having a third current terminal, a fourth current terminal, and a second control terminal, the first resistor coupled between the capacitor and the third current terminal, the second resistor coupled between the third current terminal and the second control terminal, and the second switch coupled between the second current source and the second control terminal; and
wherein the first switch is enabled responsive to the reset input having the first state, and the second switch is enabled responsive to the reset input having the second state.

10. The apparatus of claim 9, wherein the amplifier output is coupled to a third control terminal of a third transistor, the third transistor having a fifth current terminal coupled to a power supply and a sixth current terminal coupled to a third resistor; and wherein at least one of the first transistor or the second transistor is matched with the third transistor.

11. The apparatus of claim 3, wherein the comparator is a first comparator and the comparator output is a first comparator output; and wherein the apparatus comprises:
a second comparator having a second comparator output and third and fourth comparator inputs, the third comparator input coupled to a current feedback terminal, and the fourth comparator input coupled to the amplifier output; and
a clock generation circuit having an end cycle input and a clock output, the end cycle input coupled to the first comparator output; and
wherein the switching signal generation circuit has a reset input, a set input, and a switching signal output, the reset input coupled to the second comparator output, the set input coupled to the clock output, and the switching signal output coupled to the power control terminal.

12. The apparatus of claim 11, wherein the clock generation circuit is configured to:
responsive to the end cycle input having a first state, provide a first clock signal having a fixed clock cycle period at the clock output; and
responsive to the end cycle input having a second state, provide a second clock signal having a variable clock cycle period at the clock output; and
wherein the switching signal generation circuit is configured to generate a switching signal based on the first clock signal or the second clock signal.

13. The apparatus of claim 12, wherein the clock generation circuit is configured to end a clock cycle responsive to the second signal indicating that the ramp signal intersects with the first signal.

14. The apparatus of claim 12, wherein:
the second comparator is configured to, responsive to the first signal exceeding a threshold voltage, set an on-time of the switching signal at the switching signal output based on comparing between a third signal at the third comparator input and the first signal at the fourth comparator input; and
the switching signal generation circuit is configured to, responsive to the first signal being below the threshold voltage, set a frequency of the switching signal based on the second signal.

15. The apparatus of claim 3, wherein the switching signal generation circuit includes a latch circuit having a latch input and a latch output, the latch input coupled to the comparator output, and the latch output is coupled to a circuit input of the switching signal generation circuit.

16. A method comprising:
receiving a reference voltage and a first voltage representing a first output voltage of a power converter;
generating a first signal representing a first difference between the first voltage and the reference voltage;
generating a ramp signal that starts ramping during a first switching cycle of the power converter;
generating a second signal indicating whether the ramp signal intersects with the first signal;
stopping the first switching cycle responsive to the second signal indicating that the ramp signal intersects with the first signal;
receiving a second voltage representing a second output voltage of the power converter;
generating a third signal representing a second difference between the second voltage and the reference voltage; and
responsive to the second difference exceeding a threshold, setting an on-time of a second switching cycle of the power converter based on a peak current of the power converter.

17. The method of claim 16, wherein the ramp signal is generated by discharging a capacitor during the first switching cycle.

18. The method of claim 16, wherein the ramp signal is generated by selecting different voltages from a voltage divider during the first switching cycle.

19. The method of claim 16, further comprising: modulating a frequency of switching of the power converter based on the first difference.

* * * * *